(12) United States Patent
Do et al.

(10) Patent No.: US 8,623,711 B2
(45) Date of Patent: Jan. 7, 2014

(54) INTEGRATED CIRCUIT PACKAGING SYSTEM WITH PACKAGE-ON-PACKAGE AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 62 days.

(21) Appl. No.: 13/326,891

(22) Filed: Dec. 15, 2011

(65) Prior Publication Data
US 2013/0154120 A1 Jun. 20, 2013

(51) Int. Cl.
*H01L 21/00* (2006.01)
*H01L 23/48* (2006.01)

(52) U.S. Cl.
USPC ............................ 438/127; 257/693

(58) Field of Classification Search
USPC .......................... 438/127; 257/693
See application file for complete search history.

(56) References Cited

U.S. PATENT DOCUMENTS

| | | | |
|---|---|---|---|
| 4,714,952 A | 12/1987 | Takekawa et al. | |
| 5,707,881 A | 1/1998 | Lum | |
| 5,898,217 A * | 4/1999 | Johnston | 257/691 |
| 6,184,574 B1 | 2/2001 | Bissey | |
| 6,194,291 B1 | 2/2001 | DiStefano et al. | |
| 6,238,952 B1 | 5/2001 | Lin | |
| 6,335,565 B1 * | 1/2002 | Miyamoto et al. | 257/686 |
| 6,492,719 B2 * | 12/2002 | Miyamoto et al. | 257/686 |
| 6,562,660 B1 | 5/2003 | Sakamoto et al. | |
| 6,731,013 B2 | 5/2004 | Juso et al. | |
| 6,734,550 B2 * | 5/2004 | Martin et al. | 257/704 |
| 6,889,429 B2 | 5/2005 | Celaya et al. | |
| 6,970,005 B2 | 11/2005 | Rincon et al. | |
| 7,049,177 B1 | 5/2006 | Fan et al. | |
| 7,060,535 B1 * | 6/2006 | Sirinorakul et al. | 438/123 |
| 7,199,453 B2 | 4/2007 | Lai et al. | |
| 7,291,908 B2 | 11/2007 | Pan et al. | |
| 7,405,106 B2 | 7/2008 | Maloney et al. | |
| 7,548,430 B1 | 6/2009 | Huemoeller et al. | |
| 7,554,179 B2 | 6/2009 | Shim et al. | |
| 7,618,846 B1 * | 11/2009 | Pagaila et al. | 438/113 |
| 7,622,801 B2 | 11/2009 | Kurita | |
| 7,777,351 B1 * | 8/2010 | Berry et al. | 257/778 |
| 7,786,557 B2 * | 8/2010 | Hsieh et al. | 257/676 |
| 7,791,203 B2 | 9/2010 | Boon et al. | |
| 7,923,304 B2 * | 4/2011 | Choi et al. | 438/127 |
| 7,928,552 B1 * | 4/2011 | Cho et al. | 257/686 |
| 7,936,048 B2 | 5/2011 | Otremba | |
| 7,986,048 B2 * | 7/2011 | Park et al. | 257/787 |

(Continued)

OTHER PUBLICATIONS

U.S. Appl. No. 13/102,052, filed May 5, 2011, Do et al.

(Continued)

*Primary Examiner* — Jae Lee
*Assistant Examiner* — Grant Withers
(74) *Attorney, Agent, or Firm* — Ishimaru & Associates LLP; I-Chang John Yang

(57) ABSTRACT

A method of manufacture of an integrated circuit packaging system includes: forming a peripheral lead; forming an interior conductive layer directly on the peripheral lead; forming a vertical connector directly on the interior conductive layer, the vertical connector having a connector top side; connecting an integrated circuit to the interior conductive layer; and forming an encapsulation over the integrated circuit, the encapsulation having an encapsulation top side coplanar with the connector top side.

8 Claims, 10 Drawing Sheets

(56) References Cited

U.S. PATENT DOCUMENTS

| | | | |
|---|---|---|---|
| 7,989,270 B2* | 8/2011 | Huang et al. | 438/127 |
| 8,053,275 B2* | 11/2011 | Hasegawa | 438/106 |
| 8,097,490 B1* | 1/2012 | Pagaila et al. | 438/106 |
| 8,133,762 B2* | 3/2012 | Pagaila et al. | 438/117 |
| 8,174,109 B2* | 5/2012 | Uchiyama | 257/686 |
| 8,178,976 B2 | 5/2012 | Dunne et al. | |
| 8,193,037 B1 | 6/2012 | Bathan et al. | |
| 8,258,008 B2 | 9/2012 | Lee et al. | |
| 8,283,205 B2* | 10/2012 | Pagaila et al. | 438/106 |
| 8,372,689 B2* | 2/2013 | Lee et al. | 438/107 |
| 2001/0005601 A1* | 6/2001 | Shin et al. | 438/106 |
| 2002/0030972 A1 | 3/2002 | Ali et al. | |
| 2002/0084522 A1 | 7/2002 | Yoshizawa et al. | |
| 2002/0117743 A1* | 8/2002 | Nakatani et al. | 257/687 |
| 2002/0134582 A1 | 9/2002 | Celaya et al. | |
| 2003/0006055 A1 | 1/2003 | Chien-Hung et al. | |
| 2003/0203540 A1 | 10/2003 | Hur | |
| 2004/0063246 A1 | 4/2004 | Karnezos | |
| 2004/0262724 A1 | 12/2004 | Hsu | |
| 2005/0146018 A1* | 7/2005 | Jang et al. | 257/698 |
| 2005/0156291 A1 | 7/2005 | Shiu et al. | |
| 2005/0161251 A1 | 7/2005 | Mori et al. | |
| 2005/0248041 A1 | 11/2005 | Kuah et al. | |
| 2005/0258529 A1 | 11/2005 | Green et al. | |
| 2005/0263320 A1 | 12/2005 | Igarashi et al. | |
| 2006/0033516 A1 | 2/2006 | Rincon et al. | |
| 2006/0060960 A1 | 3/2006 | Cho et al. | |
| 2006/0118941 A1 | 6/2006 | Lai et al. | |
| 2006/0125080 A1* | 6/2006 | Hsu | 257/693 |
| 2007/0018292 A1 | 1/2007 | Sutardja | |
| 2007/0132089 A1* | 6/2007 | Jiang et al. | 257/700 |
| 2007/0145548 A1 | 6/2007 | Park et al. | |
| 2007/0170559 A1 | 7/2007 | Camacho et al. | |
| 2007/0181989 A1* | 8/2007 | Corisis et al. | 257/686 |
| 2007/0219033 A1 | 9/2007 | Otremba | |
| 2008/0006942 A1* | 1/2008 | Park et al. | 257/738 |
| 2008/0036050 A1* | 2/2008 | Lin et al. | 257/659 |
| 2008/0182398 A1 | 7/2008 | Carpenter et al. | |
| 2009/0014859 A1* | 1/2009 | Jeung et al. | 257/686 |
| 2009/0039523 A1* | 2/2009 | Jiang et al. | 257/777 |
| 2009/0152740 A1 | 6/2009 | Park et al. | |
| 2009/0184412 A1* | 7/2009 | Yasunaga | 257/693 |
| 2009/0236752 A1 | 9/2009 | Lee et al. | |
| 2010/0001384 A1 | 1/2010 | Bathan et al. | |
| 2010/0032821 A1* | 2/2010 | Pagaila et al. | 257/686 |
| 2010/0044850 A1* | 2/2010 | Lin et al. | 257/690 |
| 2010/0072570 A1* | 3/2010 | Pagaila et al. | 257/528 |
| 2010/0181658 A1 | 7/2010 | Yamashita | |
| 2010/0216281 A1 | 8/2010 | Pagaila et al. | |
| 2010/0244208 A1 | 9/2010 | Pagaila et al. | |
| 2010/0244219 A1* | 9/2010 | Pagaila et al. | 257/686 |
| 2011/0062598 A1 | 3/2011 | Lam | |
| 2011/0068478 A1* | 3/2011 | Pagaila et al. | 257/774 |
| 2011/0147901 A1* | 6/2011 | Huang et al. | 257/660 |
| 2011/0244636 A1* | 10/2011 | Kondo | 438/127 |
| 2011/0254172 A1* | 10/2011 | Park et al. | 257/774 |
| 2012/0061822 A1 | 3/2012 | Pagaila | |
| 2012/0119360 A1* | 5/2012 | Kim et al. | 257/737 |
| 2012/0146235 A1* | 6/2012 | Choi et al. | 257/774 |
| 2012/0168963 A1* | 7/2012 | Huang et al. | 257/774 |
| 2012/0181689 A1* | 7/2012 | Do et al. | 257/737 |
| 2012/0199972 A1* | 8/2012 | Pagaila et al. | 257/737 |
| 2012/0200303 A1 | 8/2012 | Guo et al. | |
| 2012/0273931 A1 | 11/2012 | Yang et al. | |
| 2012/0273947 A1* | 11/2012 | Mo | 257/738 |
| 2012/0280377 A1* | 11/2012 | Do et al. | 257/676 |
| 2012/0280408 A1* | 11/2012 | Do et al. | 257/782 |
| 2012/0319286 A1* | 12/2012 | Yang et al. | 257/773 |
| 2012/0319295 A1* | 12/2012 | Chi et al. | 257/774 |
| 2012/0326325 A1* | 12/2012 | Choi et al. | 257/774 |
| 2013/0049218 A1* | 2/2013 | Gong et al. | 257/774 |
| 2013/0052777 A1* | 2/2013 | Xu et al. | 438/127 |
| 2013/0062761 A1* | 3/2013 | Lin et al. | 257/738 |
| 2013/0075899 A1* | 3/2013 | Huang et al. | 257/737 |
| 2013/0075902 A1* | 3/2013 | Chow et al. | 257/737 |
| 2013/0078915 A1* | 3/2013 | Zhao et al. | 455/41.1 |
| 2013/0154072 A1 | 6/2013 | Do et al. | |
| 2013/0154080 A1 | 6/2013 | Do et al. | |

OTHER PUBLICATIONS

U.S. Appl. No. 12/964,617, filed Dec. 9, 2010, Choi et al.
U.S. Appl. No. 13/298,267, filed Nov. 16, 2011, Kim et al.
U.S. Appl. No. 13/102,041, filed May 5, 2011, Do et al.

* cited by examiner

INTEGRATED CIRCUIT PACKAGING SYSTEM WITH PACKAGE-ON-PACKAGE AND METHOD OF MANUFACTURE THEREOF

CROSS-REFERENCE TO RELATED APPLICATIONS

The present application contains subject matter related to the following concurrently filed patent applications:

U.S. patent application Ser. No. 13/326,728 by Byung Tai Do, Arnel Senosa Trasporto and Linda Pei Ee Chua, entitled "INTEGRATED CIRCUIT PACKAGING SYSTEM WITH CONTACTS AND METHOD OF MANUFACTURE THEREOF"; and U.S. patent application Ser. No. 13/326,806 by Byung Tai Do, Arnel Senosa Trasporto and Linda Pei Ee Chua, entitled "INTEGRATED CIRCUIT PACKAGING SYSTEM WITH TERMINALS AND METHOD OF MANUFACTURE THEREOF".

All of the above related applications are assigned to STATS ChipPAC Ltd., and the

TECHNICAL FIELD

The present invention relates generally to an integrated circuit packaging system, and more particularly to a system for an integrated circuit packaging system with package-on-package.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a peripheral lead; forming an interior conductive layer directly on the peripheral lead; forming a vertical connector directly on the interior conductive layer, the vertical connector having a connector top side; connecting an integrated circuit to the interior conductive layer; and forming an encapsulation over the integrated circuit, the encapsulation having an encapsulation top side coplanar with the connector top side.

The present invention provides an integrated circuit packaging system, including: a peripheral lead; an interior conductive layer directly on the peripheral lead; a vertical connector directly on the interior conductive layer, the vertical connector having a connector top side; an integrated circuit connected to the interior conductive layer; and an encapsulation over the integrated circuit, the encapsulation having an encapsulation top side coplanar with the connector top side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
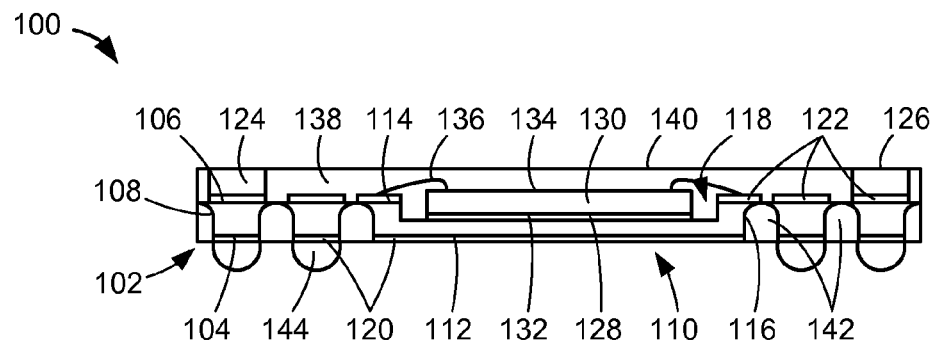
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Compared to other packaging technologies, the present invention provides a cost effective process. The present invention provides a much lower substrate cost, eliminates laser ablation process, and provides an option not to include ball attach process.

Figure 2:
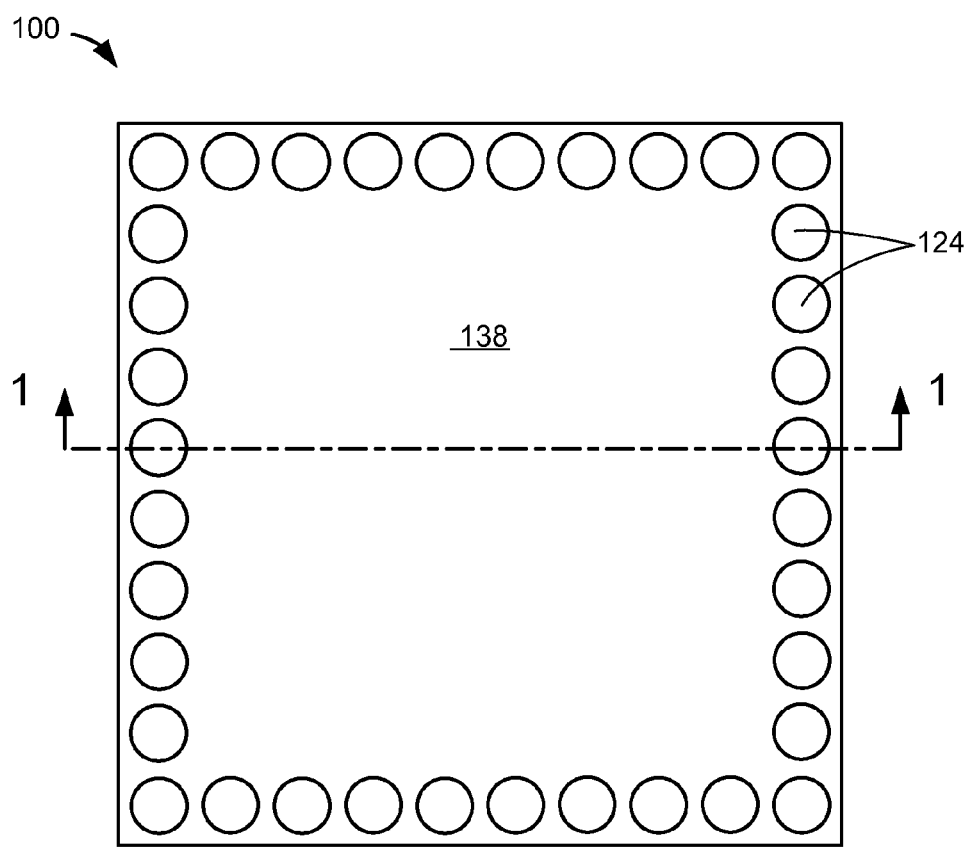
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a stackable routable circuit array.

The integrated circuit packaging system 100 can include peripheral leads 102, which are defined as structures that provide connectivity for electrical signals or electrical potential levels between the integrated circuit packaging system 100 and an external system (not shown). Each of the peripheral leads 102 can include a peripheral bottom side 104 and a peripheral top side 106 opposite the peripheral bottom side 104. The peripheral leads 102 are structurally isolated from each other.

Each of the peripheral leads 102 can include a peripheral non-horizontal side 108, which is defined as a lateral side that defines a horizontal boundary. The peripheral non-horizontal side 108 extends from the peripheral bottom side 104 to the peripheral top side 106.

The integrated circuit packaging system 100 can include a package paddle 110, which is defined as a support structure for mounting or attaching a semiconductor device thereon. The package paddle 110 can be adjacent and surrounded by the peripheral leads 102. The package paddle 110 can include at least two perimeter sides horizontally surrounded by the peripheral leads 102. The package paddle 110 can include a paddle bottom side 112 and a paddle top side 114 opposite the paddle bottom side 112.

The package paddle 110 can include a paddle non-horizontal side 116, which is defined as a lateral side that defines a horizontal boundary. The paddle non-horizontal side 116 extends from the paddle bottom side 112 to the paddle top side 114.

The package paddle 110 can include a paddle recess 118, which is an indentation from the paddle top side 114. The paddle recess 118 is vertically bounded by a non-vertical side of the package paddle 110 that is below the paddle top side 114.

The integrated circuit packaging system 100 can include an exterior conductive layer 120, which is defined as a connection structure that provides an attachment site providing electrical connection to each of the peripheral leads 102. The exterior conductive layer 120 can be formed directly on the peripheral bottom side 104 and the paddle bottom side 112.

The integrated circuit packaging system 100 can include an interior conductive layer 122, which is defined as a connection structure that provides electrical connectivity between a semiconductor device and the peripheral leads 102 or the package paddle 110. The interior conductive layer 122 can be formed directly on the peripheral top side 106 or the paddle top side 114.

The interior conductive layer 122 routes electrical connection or redistributes electrical signals between the semiconductor device and the peripheral leads 102 or the package paddle 110. For example, the interior conductive layer 122 can represent a connection structure including a redistribution layer.

The integrated circuit packaging system 100 can include vertical connectors 124, which are defined as structures that provide electrical connectivity between the integrated circuit packaging system 100 and a semiconductor package or another integrated circuit packaging system (not shown) mounted thereon. Each of the vertical connectors 124 can be formed directly on the interior conductive layer 122. For example, the vertical connectors 124 can represent electrical connectivity structure including conductive columns, conductive bumps, and conductive studs.

Each of the vertical connectors 124 can include a connector top side 126. The connector top side 126 can optionally include a plating layer of electrically conductive material including gold (Au), nickel (Ni), palladium (Pd), any other metal, a metal alloy, or a combination thereof.

The integrated circuit packaging system 100 can include an attach layer 128, which is defined as a structure for mounting a semiconductor device on a support structure. The integrated circuit packaging system 100 can include an integrated circuit 130, which is defined as a semiconductor device. The integrated circuit 130 can include an inactive side 132 and an active side 134 opposite the inactive side 132.

The integrated circuit 130 can be mounted over the peripheral leads 102 or the package paddle 110. The attach layer 128 can be attached to the inactive side 132 and the package paddle 110. The integrated circuit 130 can be mounted with the inactive side 132 facing the package paddle 110 and within the paddle recess 118.

The integrated circuit packaging system 100 can include internal connectors 136, which are defined as electrically conductive connectors. The internal connectors 136 can be connected or attached to the interior conductive layer 122 and the active side 134. One of the internal connectors 136 can be attached to a top extent of a portion of the interior conductive layer 122 that is directly on one of the peripheral leads 102, directly over which none of the vertical connectors 124 is formed.

The integrated circuit packaging system 100 can include an encapsulation 138, which is defined as a package cover of a semiconductor package to hermetically seal a semiconductor device providing mechanical and environmental protection. The encapsulation 138 can be formed covering or over the peripheral top side 106, the paddle top side 114, the paddle recess 118, the interior conductive layer 122, the vertical connectors 124, the attach layer 128, the integrated circuit 130, and the internal connectors 136.

Each of the vertical connectors 124 can be formed directly on a top extent of a portion of the interior conductive layer 122 that is directly on one of the peripheral leads 102 horizontally closest to a periphery of the encapsulation 138. The connector top side 126 can be exposed from the encapsulation 138. The connector top side 126 can be coplanar with an encapsulation top side 140 of the encapsulation 138.

The integrated circuit packaging system 100 can include an insulation layer 142, which is defined as a protection layer that protects a portion of a bottom extent of the interior conductive layer 122. The insulation layer 142 can be formed directly on the peripheral non-horizontal side 108, the paddle non-horizontal side 116, a non-horizontal side of the exterior conductive layer 120, a bottom extent of a portion of the interior conductive layer 122, a bottom extent of portion of the encapsulation 138, or a combination thereof. The insulation layer 142 can electrically isolate one of the peripheral leads 102 from another of the peripheral leads 102 or one of the peripheral leads 102 from the package paddle 110.

For illustration purposes, bottom extents of the exterior conductive layer 120 and the insulation layer 142 are shown coplanar with each other, although it is understood that the bottom extents can be below or above from each other. For example, a bottom extent of the insulation layer 142 can be above a bottom extent of the exterior conductive layer 120. Also for example, the peripheral bottom side 104, the paddle bottom side 112, and a bottom extent of the insulation layer 142 can be coplanar with each other.

The integrated circuit packaging system 100 can optionally include external connectors 144, which are defined as electrically conductive connectors attached to the exterior conductive layer 120 and the external system. The external connectors 144 can represent electrical connectors including conductive balls. For example, the external connectors can represent electrical connectors including solder balls.

The integrated circuit packaging system 100 can include stackable design options to improve a capacity in memory of a routable circuit. The integrated circuit packaging system 100 can include the vertical connectors 124, each having the connector top side 126, on top of a package to provide stacking options including a one-to-one stacking.

A single layer of routing can be limited in space and routability because it is constricted to the available area. Hence, a multiple-layer routable circuit has been added in the integrated circuit packaging system 100 to provide increased spacing for routing and flexibility in bonding. The integrated circuit packaging system 100 can include layers of a dielectric material to enable a multi-layer additive routable conductive trace.

An initial layer of the dielectric material serves as an insulator and a protective coat to a first layer of an additive routable conductive trace, which is on top of a copper (Cu) or other metal substrate. Another additive routable conductive trace can be formed on top of the first layer by via creation and isolated by the initial layer of the dielectric material. The integrated circuit packaging system 100 can include any number of additive routable conductive traces. For example, the integrated circuit packaging system 100 can include two or more of the additive routable conductive traces.

It has been discovered that the vertical connectors 124 directly on the interior conductive layer 122 provide improved reliability by providing a robust structural integrity with each of the vertical connectors 124 having the connector top side 126 for mounting a stack semiconductor package thereon resulting in a stackable structure that is aptly designed for memory devices thereby further improving memory capacity of existing designs, with routable circuit, that have limited memory capacity.

It has also been discovered that the package paddle 110 provides improved vertical height profile reduction for the integrated circuit packaging system 100 with the integrated circuit 130 mounted within the paddle recess 118.

It has further been discovered that the paddle recess 118 provides improved reliability for the integrated circuit 130 to mount therewithin resulting in reduced wire span for the internal connectors 136 to be attached to the integrated circuit 130 and the interior conductive layer 122 thereby eliminating electrical shorts between the internal connectors 136.

It has further been discovered that the insulation layer 142 provides improved reliability with a bottom extent of the insulation layer 142 coplanar with a bottom extent of the exterior conductive layer 120 and with the peripheral non-horizontal side 108 and the paddle non-horizontal side 116 covered by the insulation layer 142 by providing lead interlocking resulting in elimination of lead pullouts.

It has further been discovered that the interior conductive layer 122 provides improved reliability by employing routable method resulting in shortened wire lengths for the internal connectors 136.

Referring now to FIG. 2, therein is shown a top view of the integrated circuit packaging system 100. The top view depicts an array of a number of the vertical connectors 124 adjacent a periphery of the encapsulation 138. The vertical connectors 124 can be partially exposed from the encapsulation 138.

Figure 3:
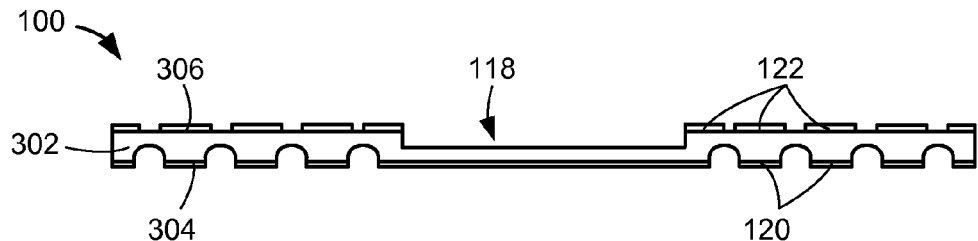
FIG. 3 is a cross-sectional view of the integrated circuit packaging system in a plating phase of manufacture.

Referring now to FIG. 3, therein is shown a cross-sectional view of the integrated circuit packaging system 100 in a plating phase of manufacture. The integrated circuit packaging system 100 can include a carrier 302, which is defined as a support structure formed with a conductive material. The carrier 302 can include a conductive material including copper (Cu), any other metals, or metallic alloys. The carrier 302 can represent a support structure including a leadframe or a substrate.

The carrier 302 can include a carrier bottom side 304 and a carrier top side 306 opposite the carrier bottom side 304. The carrier top side 306 can be plated with the interior conductive layer 122 directly thereon. The carrier 302 can include the paddle recess 118 having a top extent below the carrier top side 306. For example, the interior conductive layer 122 can include an additive routable conductive trace.

The carrier bottom side 304 can be plated with the exterior conductive layer 120. The exterior conductive layer 120 can represent electrical attachment sites including bottom terminals.

Portions of the carrier 302 at the carrier bottom side 304 surrounding non-horizontal sides of a number of the exterior conductive layer 120 can be partially removed. For example, the carrier 302 can be partially removed with a removal process including pre-plated leadframe (PPF) selective etching.

For illustration purposes, the carrier 302 is shown pre-etched at the carrier bottom side 304, although it is understood that the carrier 302 can optionally be non-etched and partially removed at a subsequent phase. For example, the carrier 302 can be partially removed at the carrier bottom side 304 with the removal process after molding in a subsequent phase.

In other embodiments of the present invention, a patterning process can be performed to form the exterior conductive layer 120 directly on the carrier bottom side 304. Portions of the carrier 302 at the carrier bottom side 304 surrounding non-horizontal sides of the exterior conductive layer 120 can be non-removed in the plating phase. Also in other embodiments of the present invention, a patterning process can be performed to form another conductive layer (not shown) directly on a top extent of the paddle recess 118.

In other embodiments of the present invention, the integrated circuit packaging system 100 can include an application process of a layer of dielectric material and a via formation process to form holes in the layer of the dielectric material by selectively remove portions of the layer of the dielectric material. The integrated circuit packaging system 100 can include a formation process of a second layer of an additive routable conductive trace.

The integrated circuit packaging system 100 can include any number of additive routable conductive traces. The direction of the additive routable conductive traces in a paddle area can be outward from the paddle area. The direction of the additive routable conductive traces outside the paddle area is inward towards the paddle area.

Figure 4:
FIG. 4 is the structure of FIG. 3 in a conductor-formation phase.

Referring now to FIG. 4, therein is shown the structure of FIG. 3 in a conductor-formation phase. The integrated circuit packaging system 100 can include the vertical connectors 124 formed directly on portions of the interior conductive layer 122. The vertical connectors 124 can represent a build up layer. The vertical connectors 124 can be formed with an electrically conductive material including copper (Cu), any other metal, or metallic material.

Figure 5:
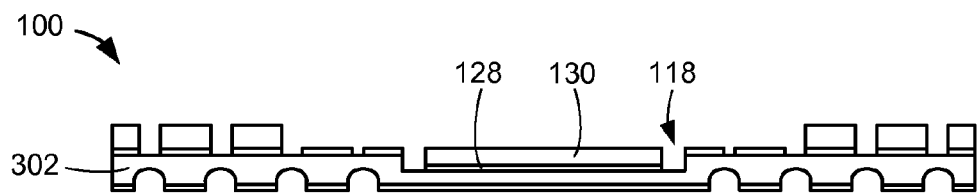
FIG. 5 is the structure of FIG. 4 in an attachment phase.

Referring now to FIG. 5, therein is shown the structure of FIG. 4 in an attachment phase. The integrated circuit packaging system 100 can include the attach layer 128 attached to the integrated circuit 130 and the carrier 302. The integrated circuit 130 can be mounted within the paddle recess 118.

For example, the attach layer 128 can include an attach material including a die attach film, an adhesive material, or an epoxy. Also for example, the integrated circuit 130 can represent a semiconductor device including a wirebond chip, a flip chip, or a silicon (Si) die.

Figure 6:
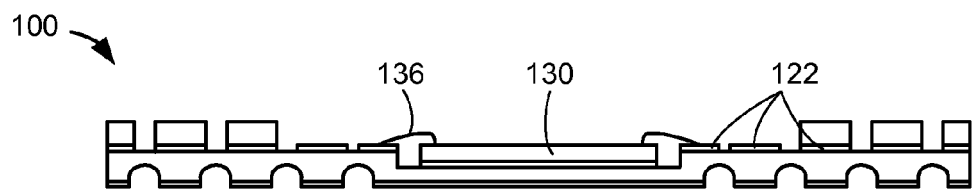
FIG. 6 is the structure of FIG. 5 in an internal connection phase.

Referring now to FIG. 6, therein is shown the structure of FIG. 5 in an internal connection phase. The integrated circuit packaging system 100 can include the internal connectors 136 attached to the integrated circuit 130 and portions of a number of the interior conductive layer 122. For example, the internal connectors 136 can represent electrically conductive connectors including bond wires or conductive bumps.

Figure 7:
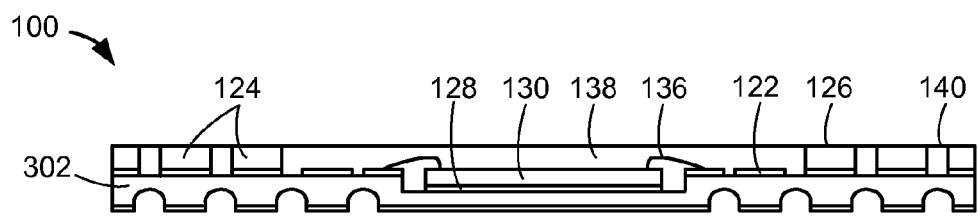
FIG. 7 is the structure of FIG. 6 in a molding phase.

Referring now to FIG. 7, therein is shown the structure of FIG. 6 in a molding phase. The integrated circuit packaging system 100 can include a molding process to form the encapsulation 138. The encapsulation 138 can be formed on the carrier 302, the interior conductive layer 122, the vertical connectors 124, the attach layer 128, the integrated circuit 130, and the internal connectors 136. The vertical connectors 124 can be partially exposed from the encapsulation 138. The connector top side 126 can be coplanar with the encapsulation top side 140. For example, the encapsulation 138 can be formed with a molding process including film assist.

Figure 8:
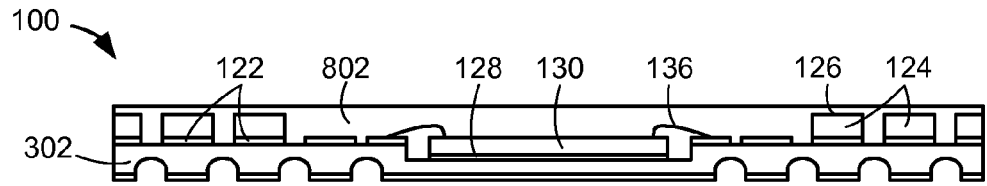
FIG. 8 is the structure of FIG. 7 in another molding phase.

Referring now to FIG. 8, therein is shown the structure of FIG. 7 in another molding phase. The integrated circuit packaging system 100 can include another molding process as a different process from the molding process in the molding phase in FIG. 7. The another molding process can be performed instead of the molding process. For example, the another molding process can include an over mold process.

The another molding process can be performed to form a mold cover 802, which is defined as a package cover of a semiconductor package to hermetically seal a semiconductor device providing mechanical and environmental protection. The mold cover 802 can be formed on the carrier 302, the interior conductive layer 122, the vertical connectors 124, the attach layer 128, the integrated circuit 130, and the internal connectors 136. The mold cover 802 can be formed over the connector top side 126.

Figure 9:
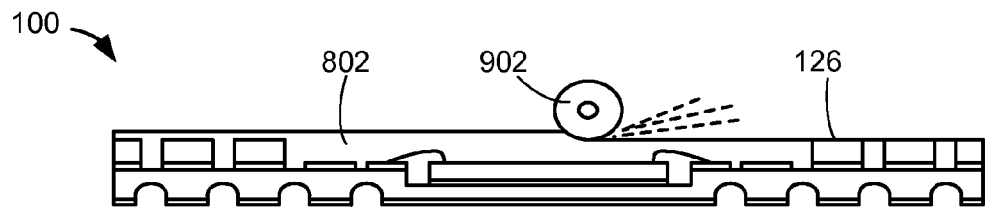
FIG. 9 is the structure of FIG. 8 in a mold-removal phase.

Referring now to FIG. 9, therein is shown the structure of FIG. 8 in a mold-removal phase. The mold-removal phase is performed after the another molding phase. The integrated circuit packaging system 100 can optionally include a removal process to partially remove a portion of the mold cover 802 at a top extent of the mold cover 802 to form the encapsulation 138 of FIG. 1. FIG. 9 depicts the mold cover 802 in a process of being partially removed.

The mold cover 802 can be partially removed with a removal tool 902 including a grinding tool. The mold cover 802 can be partially removed to form the connector top side 126. The connector top side 126 can include removal marks characteristic of the mold cover 802 being partially removed. The removal marks can include grinding marks, sanding marks, or other physical removal marks.

Figure 10:
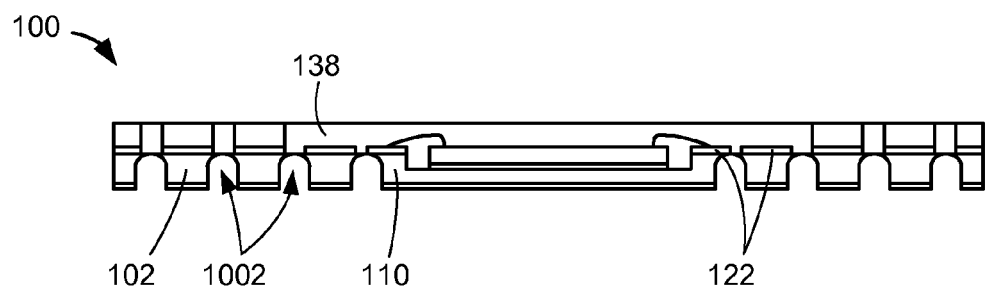
FIG. 10 is the structure of FIG. 7 or FIG. 9 in a carrier-removal phase.

Referring now to FIG. 10, therein is shown the structure of FIG. 7 or FIG. 9 in a carrier-removal phase. The integrated circuit packaging system 100 can include a removal process including bottom etching to partially remove portions of the carrier 302 of FIG. 3 to form carrier openings 1002. Portions of bottom extents of the encapsulation 138 and the interior conductive layer 122 can be exposed by the carrier openings 1002. The carrier 302 can be partially removed at the carrier bottom side 304 of FIG. 3. The peripheral leads 102 and the package paddle 110 can be formed with the carrier 302 partially removed.

Figure 11:
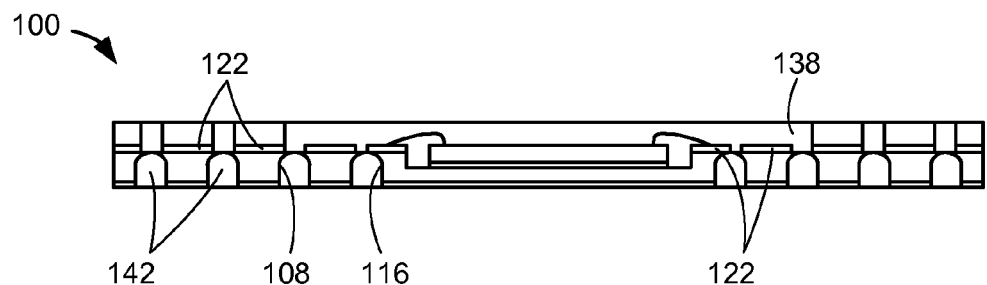
FIG. 11 is the structure of FIG. 10 in an insulation-formation phase.

Referring now to FIG. 11, therein is shown the structure of FIG. 10 in an insulation-formation phase. The integrated circuit packaging system 100 can include the insulation layer 142 to provide protection to portions of a bottom extent of the interior conductive layer 122 exposed by the carrier openings 1002 of FIG. 10. The insulation layer 142 can include an insulation material including a passivation, a solder resist, an epoxy, or an adhesive. The insulation layer 142 can be formed directly on the peripheral non-horizontal side 108, the paddle non-horizontal side 116, bottom extents of portions of the interior conductive layer 122 and the encapsulation 138, or a combination thereof.

Figure 12:
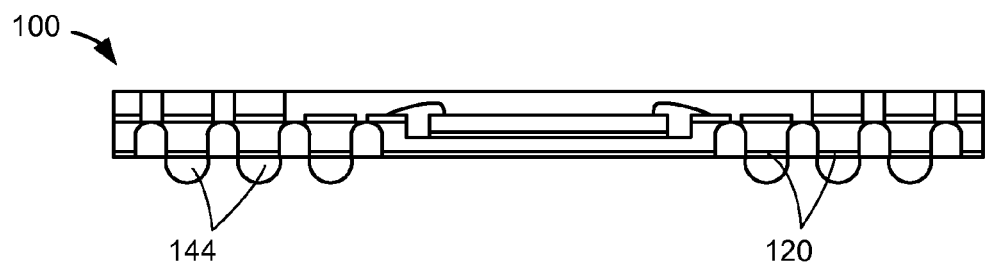
FIG. 12 is the structure of FIG. 11 in a bottom interconnection phase.

Referring now to FIG. 12, therein is shown the structure of FIG. 11 in a bottom interconnection phase. The integrated circuit packaging system 100 can optionally include the external connectors 144 attached to the exterior conductive layer 120. The external connectors 144 can be formed with a conductive material including solder, a metal, or a metallic alloy.

In a subsequent phase, the integrated circuit packaging system 100 can include a package singulation process to produce individual units or packages of the integrated circuit packaging system 100. The package singulation process can include a mechanical or optical process.

Figure 13:
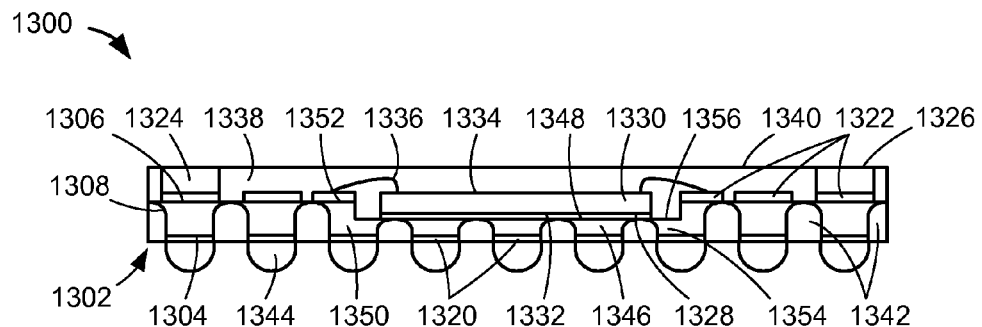
FIG. 13 is a cross-sectional view of an integrated circuit packaging system in a second embodiment of the present invention.

Referring now to FIG. 13, therein is shown a cross-sectional view of an integrated circuit packaging system 1300 in a second embodiment of the present invention. In a manner similar to the integrated circuit packaging system 100 of FIG. 1, the integrated circuit packaging system 1300 includes peripheral leads 1302, each having a peripheral bottom side 1304, a peripheral top side 1306, and a peripheral non-horizontal side 1308. In a manner similar to the integrated circuit packaging system 100, the integrated circuit packaging system 1300 includes an exterior conductive layer 1320, an interior conductive layer 1322, and vertical connectors 1324 with each of the vertical connectors 1324 having a connector top side 1326.

In a manner similar to the integrated circuit packaging system 100, the integrated circuit packaging system 1300 includes an attach layer 1328 and an integrated circuit 1330 having an inactive side 1332 and an active side 1334. In a manner similar to the integrated circuit packaging system 100, the integrated circuit packaging system 1300 includes internal connectors 1336 and an encapsulation 1338 having an encapsulation top side 1340. In a manner similar to the integrated circuit packaging system 100, the integrated circuit packaging system 1300 includes an insulation layer 1342 and external connectors 1344.

The integrated circuit packaging system 1300 can include central leads 1346, which are defined as structures that provide connectivity between the integrated circuit packaging system 1300 and an external system (not shown). The central leads 1346 can be directly under the integrated circuit 1330. The central leads 1346 conduct heat away from the integrated circuit 1330 to an external system (not shown). Each of the central leads 1346 can include a central lead top side 1348 below the peripheral top side 1306. The central leads 1346 can be surrounded by the peripheral leads 1302.

The integrated circuit packaging system 1300 can include interior leads 1350, which are defined as structures that provide connectivity between the integrated circuit packaging system 1300 and the external system. The interior leads 1350 can be closest to a non-horizontal side of the integrated circuit 1330. The interior leads 1350 provide connectivity for electrical signals or electrical potential levels between the integrated circuit 1330 and the external system. The interior leads 1350 can be between the central leads 1346 and the peripheral leads 1302.

Each of the interior leads 1350 can include an interior lead top side 1352 and an interior lead recess portion 1354. The interior lead recess portion 1354 is defined as a portion of each of the interior leads 1350. The interior lead recess portion 1354 can include an interior lead recess top side 1356 below the interior lead top side 1352 and the peripheral top side 1306. The interior lead recess portion 1354 is a portion of each of the interior leads 1350 that is closest to the integrated circuit 1330.

The interior leads 1350, the central leads 1346, and the peripheral leads 1302 are structurally isolated from each other. The peripheral bottom side 1304, bottom extents of the interior leads 1350, and bottom extents of the central leads 1346 can be coplanar with each other. The peripheral top side 1306 and the interior lead top side 1352 can be coplanar with each other. The central lead top side 1348 and the interior lead recess top side 1356 can be coplanar with each other.

The central leads 1346, the interior leads 1350, or a combination thereof altogether function as a support structure including a paddle for mounting or attaching the integrated circuit 1330 thereto. The inactive side 1332 can be attached to the central leads 1346, the interior leads 1350, or a combination thereof with the attach layer 1328. The attach layer 1328 can be attached to the central lead top side 1348, the interior lead recess top side 1356, or a combination thereof.

The interior conductive layer 1322 can be formed directly on the interior lead top side 1352. The exterior conductive layer 1320 can be formed directly on bottom extents of the central leads 1346 and the interior leads 1350.

Non-horizontal sides of the central leads 1346 and the interior leads 1350 can include curve surfaces. The insulation layer 1342 can be formed directly on the non-horizontal sides of the central leads 1346 and the interior leads 1350. The insulation layer 1342 can be formed directly on a portion of a bottom extent of the attach layer 1328.

It has been discovered that the vertical connectors 1324 directly on the interior conductive layer 1322 provide improved reliability by providing a robust structural integrity with each of the vertical connectors 1324 having the connector top side 1326 for mounting a stack semiconductor package thereon.

It has also been discovered that the central leads 1346 and the interior leads 1350 provide improved vertical height profile reduction for the integrated circuit packaging system 1300 with the integrated circuit 1330 mounted on the central lead top side 1348, the interior lead recess top side 1356, or a combination thereof that is below the central lead top side 1348.

It has further been discovered that the central lead top side 1348 and the interior lead top side 1352 provide improved reliability for the integrated circuit 1330 to mount thereon resulting in reduced wire span for the internal connectors 1336 to be attached to the integrated circuit 1330 and the interior conductive layer 1322 thereby eliminating electrical shorts between the internal connectors 1336.

It has further been discovered that the insulation layer 1342 provides improved reliability with a bottom extent of the insulation layer 1342 coplanar with a bottom extent of the exterior conductive layer 1320 and with the peripheral non-horizontal side 1308, non-horizontal sides of the central leads 1346, and non-horizontal sides of the interior leads 1350 covered by the insulation layer 1342 by providing lead interlocking resulting in elimination of lead pullouts.

It has further been discovered that the interior conductive layer 1322 provides improved reliability by employing routable method resulting in shortened wire lengths for the internal connectors 1336.

Figure 14:
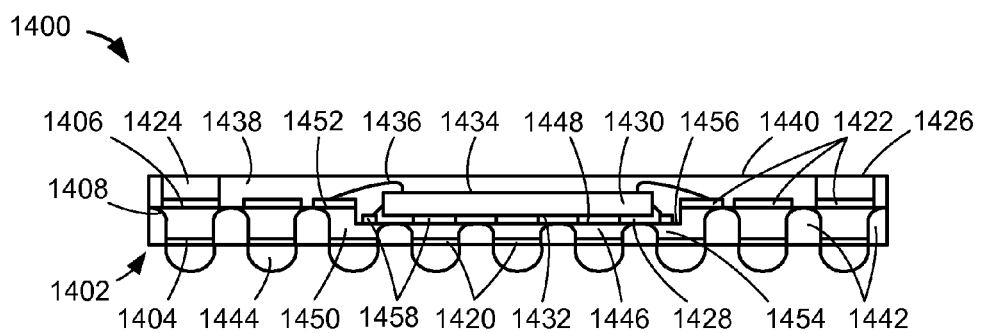
FIG. 14 is a cross-sectional view of an integrated circuit packaging system in a third embodiment of the present invention.

Referring now to FIG. 14, therein is shown a cross-sectional view of an integrated circuit packaging system 1400 in a third embodiment of the present invention. In a manner similar to the integrated circuit packaging system 100 of FIG. 1, the integrated circuit packaging system 1400 includes peripheral leads 1402, each having a peripheral bottom side 1404, a peripheral top side 1406, and a peripheral non-horizontal side 1408. In a manner similar to the integrated circuit packaging system 100, the integrated circuit packaging system 1400 includes an exterior conductive layer 1420, an interior conductive layer 1422, and vertical connectors 1424 with each of the vertical connectors 1424 having a connector top side 1426.

In a manner similar to the integrated circuit packaging system 100, the integrated circuit packaging system 1400 includes an attach layer 1428 and an integrated circuit 1430 having an inactive side 1432 and an active side 1434. In a manner similar to the integrated circuit packaging system 100, the integrated circuit packaging system 1400 includes internal connectors 1436 and an encapsulation 1438 having an encapsulation top side 1440. In a manner similar to the integrated circuit packaging system 100, the integrated circuit packaging system 1400 includes an insulation layer 1442 and external connectors 1444.

The integrated circuit packaging system 1400 can include central leads 1446, which are defined as structures that provide connectivity between the integrated circuit packaging system 1400 and an external system (not shown). The central leads 1446 can be directly under the integrated circuit 1430. The central leads 1446 conduct heat away from the integrated circuit 1430 to an external system (not shown). Each of the central leads 1446 can include a central lead top side 1448 below the peripheral top side 1406.

The integrated circuit packaging system 1400 can include interior leads 1450, which are defined as structures that provide connectivity between the integrated circuit packaging system 1400 and the external system. The interior leads 1450 can be closest to a non-horizontal side of the integrated circuit 1430. The interior leads 1450 provide connectivity for electrical signals or electrical potential levels between the integrated circuit 1430 and the external system.

Each of the interior leads 1450 can include an interior lead top side 1452 and an interior lead recess portion 1454. The interior lead recess portion 1454 is defined as a portion of each of the interior leads 1450. The interior lead recess portion 1454 can include an interior lead recess top side 1456 below the interior lead top side 1452. The interior lead recess portion 1454 is a portion of each of the interior leads 1450 that is closest to the integrated circuit 1430.

The interior leads 1450, the central leads 1446, and the peripheral leads 1402 are structurally isolated from each other. The peripheral bottom side 1404, bottom extents of the interior leads 1450, and bottom extents of the central leads 1446 can be coplanar with each other. The peripheral top side 1406 and the interior lead top side 1452 can be coplanar with each other. The central lead top side 1448 and the interior lead recess top side 1456 can be coplanar with each other.

The central leads 1446, the interior leads 1450, or a combination thereof altogether function as a support structure including a paddle for mounting or attaching the integrated circuit 1430 thereto. The inactive side 1432 can be attached to the central leads 1446, the interior leads 1450, or a combination thereof with the attach layer 1428. The attach layer 1428 can be attached to the central lead top side 1448, the interior lead recess top side 1456, or a combination thereof.

The interior conductive layer 1422 can be formed directly on the interior lead top side 1452. The exterior conductive layer 1420 can be formed directly on bottom extents of the central leads 1446 and the interior leads 1450.

Non-horizontal sides of the central leads 1446 and the interior leads 1450 can include curve surfaces. The insulation layer 1442 can be formed directly on the non-horizontal sides of the central leads 1446 and the interior leads 1450. The insulation layer 1442 can be formed directly on a portion of a bottom extent of the attach layer 1428.

The integrated circuit packaging system 1400 can include a recess conductive layer 1458, which is defined as a connection structure that provides electrical connectivity between the integrated circuit 1430 and the external system. The recess conductive layer 1458 can be formed below the interior conductive layer 1422. The recess conductive layer 1458 can be formed directly on the central lead top side 1448 and the interior lead recess top side 1456.

The recess conductive layer 1458 provides electrical connection or redistributes electrical signals between the interior leads 1450, the central leads 1446, or any combination thereof. For example, the recess conductive layer 1458 can represent a connection structure including a redistribution layer.

The attach layer 1428 can be attached to the recess conductive layer 1458. The integrated circuit 1430 can be mounted over or directly on the recess conductive layer 1458 with the attach layer 1428.

It has been discovered that the vertical connectors 1424 directly on the interior conductive layer 1422 provide improved reliability by providing a robust structural integrity with each of the vertical connectors 1424 having the connector top side 1426 for mounting a stack semiconductor package thereon.

It has also been discovered that the central leads 1446 and the interior leads 1450 provide improved vertical height profile reduction for the integrated circuit packaging system 1400 with the integrated circuit 1430 mounted on the central lead top side 1448, the interior lead recess top side 1456, or a combination thereof that is below the central lead top side 1448.

It has further been discovered that the central lead top side 1448 and the interior lead top side 1452 provide improved reliability for the integrated circuit 1430 to mount thereon resulting in reduced wire span for the internal connectors 1436 to be attached to the integrated circuit 1430 and the interior conductive layer 1422 thereby eliminating electrical shorts between the internal connectors 1436.

It has further been discovered that the insulation layer 1442 provides improved reliability with a bottom extent of the insulation layer 1442 coplanar with a bottom extent of the exterior conductive layer 1420 and with the peripheral non-horizontal side 1408, non-horizontal sides of the central leads 1446, and non-horizontal sides of the interior leads 1450 covered by the insulation layer 1442 by providing lead interlocking resulting in elimination of lead pullouts.

It has further been discovered that the recess conductive layer 1458 provides improved reliability by reducing wire span of the internal connectors 1436 with the recess conductive layer 1458 providing increased routing area to redistribute electrical signals between the interior leads 1450 and the central leads 1446.

It has further been discovered that the interior conductive layer 1422 and the recess conductive layer 1458 provide improved reliability by employing routable method resulting in shortened wire lengths for the internal connectors 1436.

Figure 15:
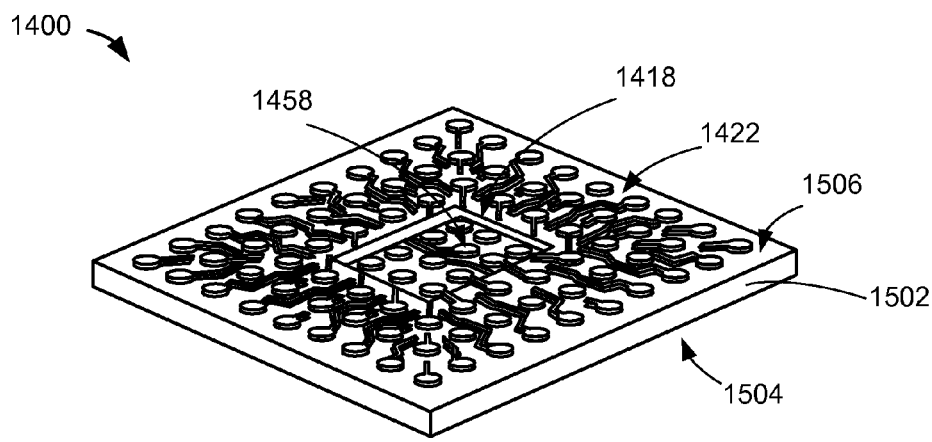
FIG. 15 is a top isometric view of the integrated circuit packaging system in a plating phase of manufacture.

Referring now to FIG. 15, therein is shown a top isometric view of the integrated circuit packaging system 1400 in a plating phase of manufacture. The integrated circuit packaging system 1400 can include a routable plated copper (Cu) sheet with a paddle cavity.

The integrated circuit packaging system 1400 can include a carrier 1502, which is defined as a support structure formed with a conductive material. The carrier 1502 can include a conductive material including copper (Cu), any other metals, or metallic alloys. The carrier 1502 can represent a support structure including a leadframe or a substrate.

The carrier 1502 can include a carrier bottom side 1504 and a carrier top side 1506 opposite the carrier bottom side 1504. The carrier top side 1506 can be plated with the interior conductive layer 1422 directly thereon. For example, the interior conductive layer 1422 can include an additive routable conductive trace. The carrier 1502 can include a paddle recess 1418 having a top extent below the carrier top side 1506. The recess conductive layer 1458 can be formed within the paddle recess 1418.

Figure 16:
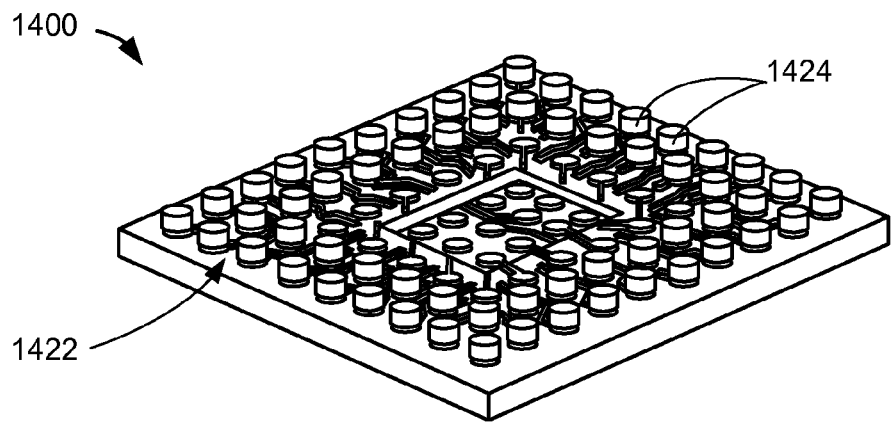
FIG. 16 is the structure of FIG. 15 in a conductor-formation phase.

Referring now to FIG. 16, therein is shown the structure of FIG. 15 in a conductor-formation phase. The integrated circuit packaging system 1400 can include a conductive material or a metal build up.

The integrated circuit packaging system 1400 can include the vertical connectors 1424 formed directly on portions of the interior conductive layer 1422. The vertical connectors 1424 can represent a build up layer. The vertical connectors 1424 can be formed with an electrically conductive material including copper (Cu), any other metal, or metallic material.

Figure 17:
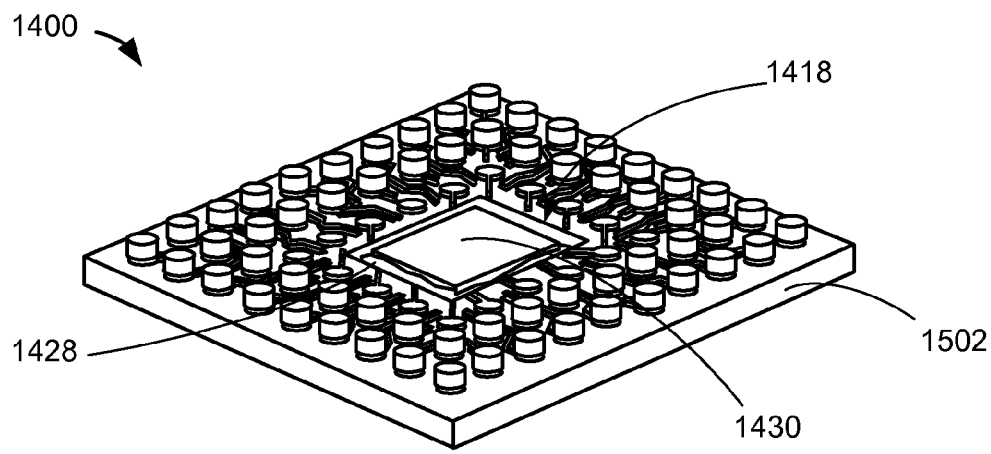
FIG. 17 is the structure of FIG. 16 in an attachment phase.

Referring now to FIG. 17, therein is shown the structure of FIG. 16 in an attachment phase. The integrated circuit packaging system 1400 can include a die attach process with the attach layer 1428 attached to the integrated circuit 1430 and the carrier 1502 within the paddle recess 1418. The integrated circuit 1430 can be mounted on the paddle recess 1418.

For example, the attach layer 1428 can include an attach material including a die attach film or an adhesive material. Also for example, the integrated circuit 1430 can represent a semiconductor device including a wirebond chip, a flip chip, or a silicon (Si) die.

Figure 18:
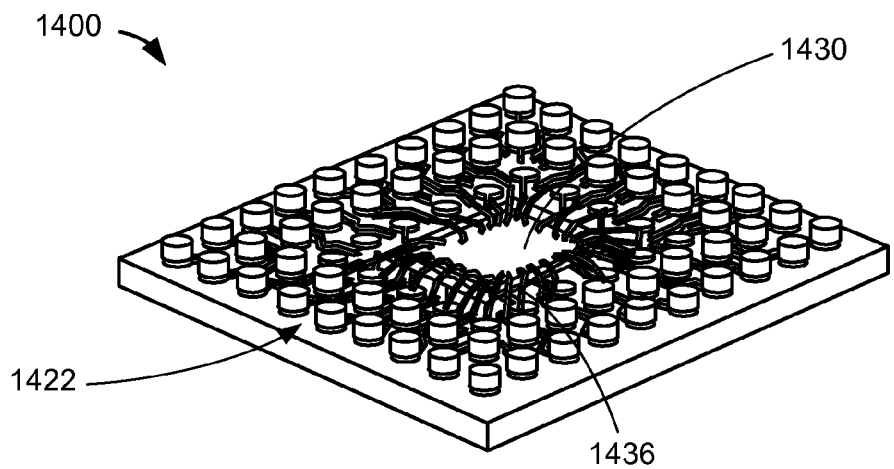
FIG. 18 is the structure of FIG. 17 in an internal connection phase.

Referring now to FIG. 18, therein is shown the structure of FIG. 17 in an internal connection phase. The integrated circuit packaging system 1400 can include the internal connectors 1436 attached to the integrated circuit 1430 and portions of a number of the interior conductive layer 1422. For example, the internal connectors 1436 can represent electrically conductive connectors including bond wires or conductive bumps.

Figure 19:
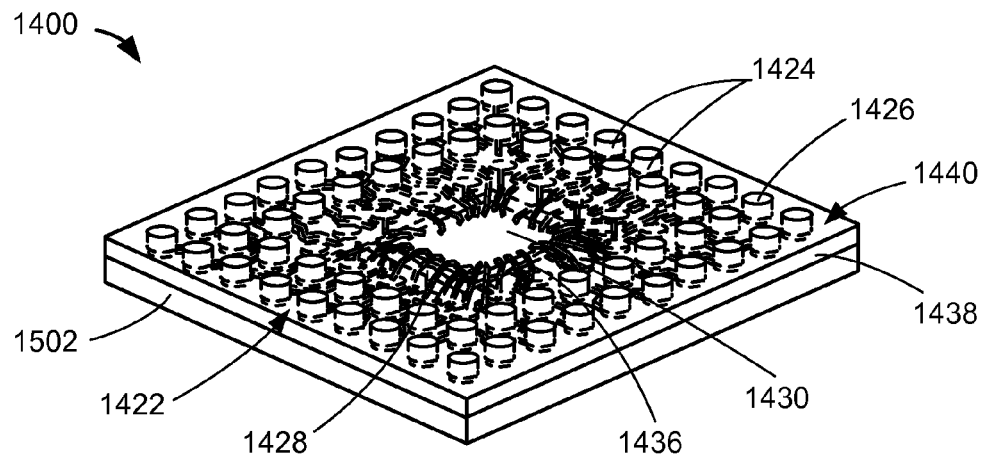
FIG. 19 is the structure of FIG. 18 in a molding phase.

Referring now to FIG. 19, therein is shown the structure of FIG. 18 in a molding phase. The integrated circuit packaging system 1400 can include a molding process to form the encapsulation 1438. The molding process can include best known methods (BKM). The molding process can include a molding method including film assist or methods previously described in FIGS. 8 and 9.

The encapsulation 1438 can be formed on the carrier 1502, the interior conductive layer 1422, the vertical connectors 1424, the attach layer 1428, the integrated circuit 1430, and the internal connectors 1436. The vertical connectors 1424 can be partially exposed from the encapsulation 1438. The connector top side 1426 can be coplanar with the encapsulation top side 1440. For example, the encapsulation 1438 can be formed with a molding process including film assist.

Figure 20:
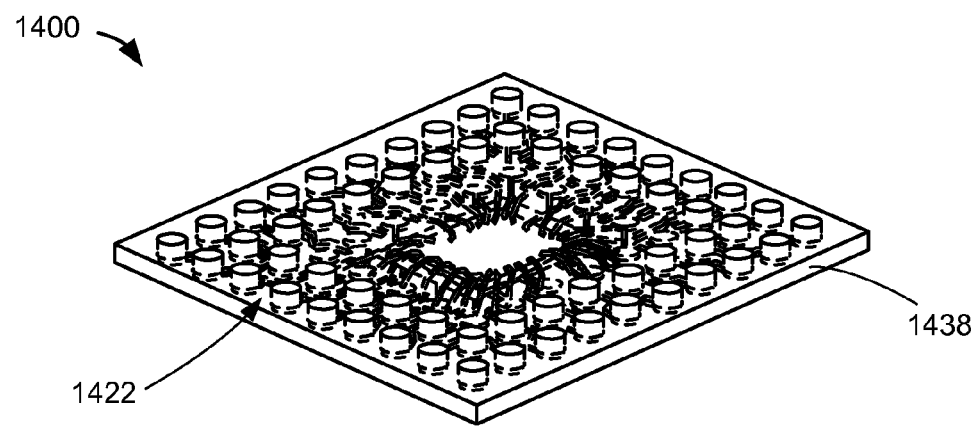
FIG. 20 is the structure of FIG. 19 in a carrier-removal phase.

Referring now to FIG. 20, therein is shown the structure of FIG. 19 in a carrier-removal phase. The integrated circuit packaging system 1400 can include a removal process including bottom etching to partially remove portions of the carrier 1502 of FIG. 15 to form the peripheral leads 1402 of FIG. 14 or bottom terminals.

Portions of bottom extents of the encapsulation 1438 and the interior conductive layer 1422 can be exposed from the carrier 1502. The carrier 1502 can be partially removed at the carrier bottom side 1504 of FIG. 15. The peripheral leads 1402 can be formed with the carrier 1502 partially removed.

Figure 21:
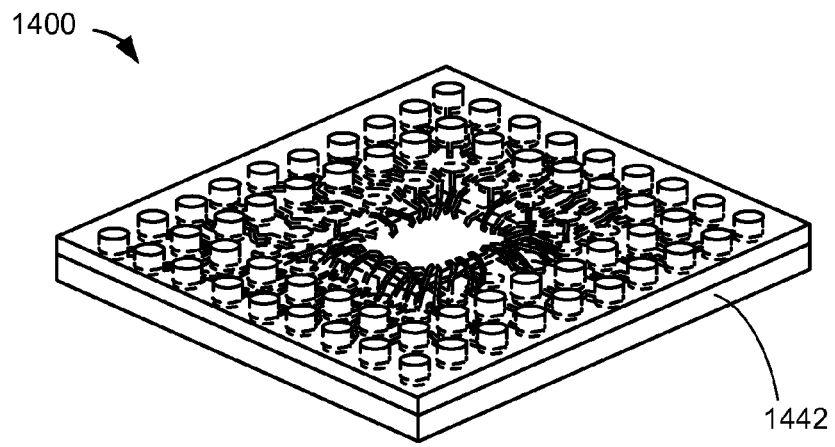
FIG. 21 is the structure of FIG. 20 in an insulation-formation phase.

Referring now to FIG. 21, therein is shown the structure of FIG. 20 in an insulation-formation phase. The integrated circuit packaging system 1400 can include circuit protection coating. The integrated circuit packaging system 1400 can include the insulation layer 1442 to provide protection to portions of a bottom extent of the interior conductive layer 1422 of FIG. 14. The insulation layer 1442 can include an insulation material including a passivation, a solder resist, an epoxy, or an adhesive.

Figure 22:
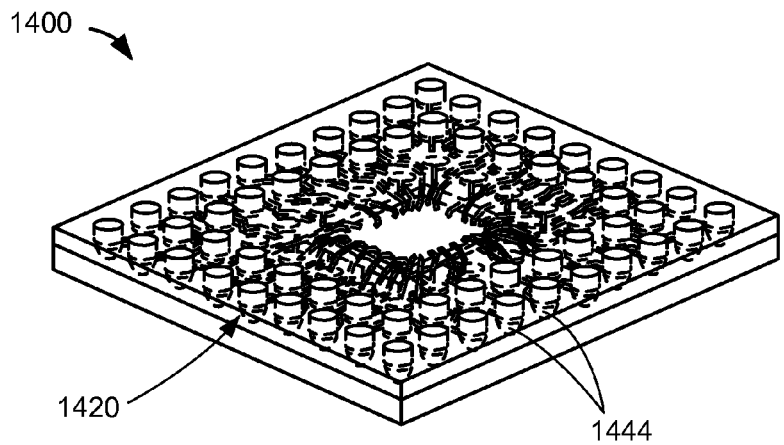
FIG. 22 is the structure of FIG. 21 in a bottom interconnection phase.

Referring now to FIG. 22, therein is shown the structure of FIG. 21 in a bottom interconnection phase. The bottom interconnection phase can include an attachment process including ball attach. The integrated circuit packaging system 1400 can optionally include the external connectors 1444 connected to the exterior conductive layer 1420. The external connectors 1444 can be formed with a conductive material including solder, a metal, or a metallic alloy. The integrated circuit packaging system 1400 can also include an option for land grid array (LGA) without the external connectors 1444.

In a subsequent phase, the integrated circuit packaging system 1400 can include a package singulation process to produce individual units or packages of the integrated circuit packaging system 1400. The package singulation process can include a mechanical or optical process.

Figure 23:
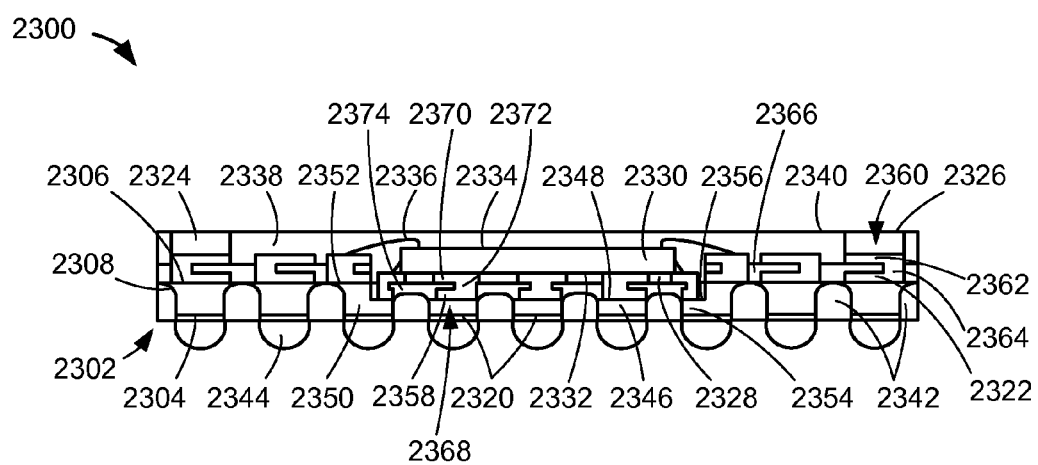
FIG. 23 is a cross-sectional view of an integrated circuit packaging system in a fourth embodiment of the present invention.

Referring now to FIG. 23, therein is shown a cross-sectional view of an integrated circuit packaging system 2300 in a fourth embodiment of the present invention. In a manner similar to the integrated circuit packaging system 100 of FIG. 1, the integrated circuit packaging system 2300 includes peripheral leads 2302, each having a peripheral bottom side 2304, a peripheral top side 2306, and a peripheral non-horizontal side 2308. In a manner similar to the integrated circuit packaging system 100, the integrated circuit packaging system 2300 includes an exterior conductive layer 2320, an interior conductive layer 2322, and vertical connectors 2324 with each of the vertical connectors 2324 having a connector top side 2326.

In a manner similar to the integrated circuit packaging system 100, the integrated circuit packaging system 2300 includes an attach layer 2328 and an integrated circuit 2330 having an inactive side 2332 and an active side 2334. In a manner similar to the integrated circuit packaging system 100, the integrated circuit packaging system 2300 includes internal connectors 2336 and an encapsulation 2338 having an encapsulation top side 2340. In a manner similar to the integrated circuit packaging system 100, the integrated circuit packaging system 2300 includes an insulation layer 2342 and external connectors 2344.

The integrated circuit packaging system 2300 can include central leads 2346, which are defined as structures that provide connectivity between the integrated circuit packaging system 2300 and an external system (not shown). The central leads 2346 can be directly under the integrated circuit 2330. The central leads 2346 conduct heat away from the integrated circuit 2330 to an external system (not shown). Each of the central leads 2346 can include a central lead top side 2348 below the peripheral top side 2306.

The integrated circuit packaging system 2300 can include interior leads 2350, which are defined as structures that provide connectivity between the integrated circuit packaging system 2300 and the external system. The interior leads 2350 can be closest to a non-horizontal side of the integrated circuit 2330. The interior leads 2350 provide connectivity for electrical signals or electrical potential levels between the integrated circuit 2330 and the external system.

Each of the interior leads 2350 can include an interior lead top side 2352 and an interior lead recess portion 2354. The interior lead recess portion 2354 is defined as a portion of each of the interior leads 2350. The interior lead recess portion 2354 can include an interior lead recess top side 2356 below the interior lead top side 2352. The interior lead recess portion 2354 is a portion of each of the interior leads 2350 that is closest to the integrated circuit 2330.

The interior leads 2350, the central leads 2346, and the peripheral leads 2302 are structurally isolated from each other. The peripheral bottom side 2304, bottom extents of the interior leads 2350, and bottom extents of the central leads 2346 can be coplanar with each other. The peripheral top side 2306 and the interior lead top side 2352 can be coplanar with each other. The central lead top side 2348 and the interior lead recess top side 2356 can be coplanar with each other.

The central leads 2346, the interior leads 2350, or a combination thereof altogether function as a support structure including a paddle for mounting or attaching the integrated circuit 2330 thereto. The inactive side 2332 can be attached to the central leads 2346, the interior leads 2350, or a combination thereof with the attach layer 2328. The attach layer 2328 can be attached to the central lead top side 2348, the interior lead recess top side 2356, or a combination thereof.

The interior conductive layer 2322 can be formed directly on the interior lead top side 2352. The exterior conductive layer 2320 can be formed directly on bottom extents of the central leads 2346 and the interior leads 2350.

Non-horizontal sides of the central leads 2346 and the interior leads 2350 can include curve surfaces. The insulation layer 2342 can be formed directly on the non-horizontal sides of the central leads 2346 and the interior leads 2350.

The integrated circuit packaging system 2300 can include a recess conductive layer 2358, which is defined as a connection structure that provides electrical connectivity between the integrated circuit 2330 and the external system. The recess conductive layer 2358 can be formed below the interior conductive layer 2322. The recess conductive layer 2358 can be formed directly on the central lead top side 2348 and the interior lead recess top side 2356.

The recess conductive layer 2358 provides electrical connection or redistributes electrical signals between the interior leads 2350, the central leads 2346, or any combination thereof. For example, the recess conductive layer 2358 can represent a connection structure including a redistribution layer.

The integrated circuit packaging system 2300 can include a multi-layer conductive structure 2360, which is defined as a connection structure with a number of conductive layers providing connectivity between the integrated circuit 2330 and the peripheral leads 2302 or between the integrated circuit 2330 and the interior leads 2350. The multi-layer conductive structure 2360 can include the interior conductive layer 2322. The multi-layer conductive structure 2360 can include an additional interior conductive layer 2362, an interior connection layer 2364, and an interior insulation layer 2366.

The interior conductive layer 2322 is defined as a connection structure that provides connectivity between the peripheral leads 2302 and the additional interior conductive layer 2362. The additional interior conductive layer 2362 is defined as a connection structure that provides connectivity between the interior conductive layer 2322 and the integrated circuit 2330. The interior conductive layer 2322 and the additional interior conductive layer 2362 route electrical connection or redistribute electrical signals between the integrated circuit 2330 and the peripheral leads 2302 or between the integrated circuit 2330 and the interior leads 2350.

The interior connection layer 2364 is defined as a connection structure that provides electrical connectivity between multiple conductive layers. The interior connection layer 2364 can be structurally and electrically connected or attached to the interior conductive layer 2322 and the additional interior conductive layer 2362. The interior insulation layer 2366 is defined as a structure that covers the interior conductive layer 2322 to provide electrical isolation between the interior conductive layer 2322 and the additional interior conductive layer 2362. The interior insulation layer 2366 can be formed with an insulation material including a dielectric material.

The interior conductive layer 2322 and the additional interior conductive layer 2362 can provide electrical connectivity for electrical signals or electrical potential levels. The interior conductive layer 2322 and the additional interior conductive layer 2362 can conduct heat away from the integrated circuit 2330 to the peripheral leads 2302 or from the integrated circuit 2330 to the interior leads 2350.

The interior conductive layer 2322 and the additional interior conductive layer 2362 can include conductive traces. For example, the interior conductive layer 2322 and the additional interior conductive layer 2362 can represent connection structures including embedded routable conductive traces, additive routable conductive traces, or redistribution layers.

A portion of a bottom extent of the interior conductive layer 2322 can be formed directly on the peripheral top side 2306 and the interior lead top side 2352. A bottom extent of the interior conductive layer 2322 can be coplanar with a bottom extent of the interior insulation layer 2366.

The interior connection layer 2364 can be formed directly on a top extent of the interior conductive layer 2322 and a bottom extent of the additional interior conductive layer 2362. The interior connection layer 2364 can be formed through the interior insulation layer 2366. The additional interior conductive layer 2362 can be formed over the interior connection layer 2364. A bottom extent of the additional interior conductive layer 2362 can be formed directly on the interior connection layer 2364 and a top extent of the interior insulation layer 2366. A portion of the additional interior conductive layer 2362 can be formed directly over a portion of the interior conductive layer 2322. The vertical connectors 2324 can be formed directly on a portion of the additional interior conductive layer 2362.

The integrated circuit packaging system 2300 can include a recess multi-layer conductive structure 2368, which is defined as a connection structure with a number of conductive layers providing connectivity between the integrated circuit 2330 and the central leads 2346 or between the integrated circuit 2330 and the interior leads 2350. The recess multi-layer conductive structure 2368 can include the recess conductive layer 2358. The recess multi-layer conductive structure 2368 can include an additional recess conductive layer 2370. The recess multi-layer conductive structure 2368 can include a recess connection layer 2372. The recess multi-layer conductive structure 2368 can include a recess insulation layer 2374.

The recess conductive layer 2358 is defined as a connection structure that provides connectivity between the central leads 2346 and the additional recess conductive layer 2370 or between the interior leads 2350 and the additional recess conductive layer 2370. The additional recess conductive layer 2370 is defined as a connection structure that provides connectivity between the recess conductive layer 2358 and the integrated circuit 2330. The recess conductive layer 2358 and the additional recess conductive layer 2370 route electrical connection or redistribute electrical signals between the integrated circuit 2330 and the central leads 2346 or between the integrated circuit 2330 and the interior leads 2350.

The recess connection layer 2372 is defined as a connection structure that provides electrical connectivity between multiple conductive layers. The recess connection layer 2372 can be structurally and electrically connected or attached to the recess conductive layer 2358 and the additional recess conductive layer 2370. The recess insulation layer 2374 is defined as a structure that covers the recess conductive layer 2358 to provide electrical isolation between the recess conductive layer 2358 and the additional recess conductive layer 2370.

The recess conductive layer 2358 and the additional recess conductive layer 2370 can provide electrical connectivity for electrical signals or electrical potential levels. The recess conductive layer 2358 and the additional recess conductive layer 2370 can conduct heat away from the integrated circuit 2330 to the central leads 2346 or from the integrated circuit 2330 to the interior leads 2350.

The recess conductive layer 2358 and the additional recess conductive layer 2370 can include conductive traces. For example, the recess conductive layer 2358 and the additional recess conductive layer 2370 can represent connection structures including embedded routable conductive traces, additive routable conductive traces, or redistribution layers.

A portion of a bottom extent of the recess conductive layer 2358 can be formed directly on the central lead top side 2348 and the interior lead recess top side 2356. A bottom extent of the recess conductive layer 2358 can be coplanar with a bottom extent of the recess insulation layer 2374. A top extent of the recess insulation layer 2374, a bottom extent of the additional recess conductive layer 2370, and a bottom extent of the interior conductive layer 2322 can be coplanar with each other.

The recess connection layer 2372 can be formed directly on a top extent of the recess conductive layer 2358 and a bottom extent of the additional recess conductive layer 2370. The recess connection layer 2372 can be formed through the recess insulation layer 2374. A bottom extent of the additional recess conductive layer 2370 can be formed directly on the recess connection layer 2372 and a top extent of the recess insulation layer 2374. A portion of the additional recess conductive layer 2370 can be formed directly over a portion of the recess conductive layer 2358.

The attach layer 2328 can be attached to the additional recess conductive layer 2370 and the interior insulation layer 2366. The integrated circuit 2330 can be mounted over or directly on the additional recess conductive layer 2370 with the attach layer 2328. The internal connectors 2336 can be attached to the active side 2334 and a top extent of the additional interior conductive layer 2362. The insulation layer 2342 can be formed directly on a portion of a bottom extent of the interior insulation layer 2366 and a portion of a bottom extent of the recess insulation layer 2374.

It has been discovered that the vertical connectors 2324 directly on the additional interior conductive layer 2362 provide improved reliability by providing a robust structural integrity with each of the vertical connectors 2324 having the connector top side 2326 for mounting a stack semiconductor package thereon.

It has also been discovered that the central leads 2346 and the interior leads 2350 provide improved vertical height profile reduction for the integrated circuit packaging system 2300 with the integrated circuit 2330 mounted on the central lead top side 2348, the interior lead recess top side 2356, or a combination thereof that is below the central lead top side 2348.

It has further been discovered that the central lead top side 2348 and the interior lead recess top side 2356 provide improved reliability for the integrated circuit 2330 to mount thereon resulting in reduced wire span for the internal connectors 2336 to be attached to the integrated circuit 2330 and the additional interior conductive layer 2362 thereby eliminating electrical shorts between the internal connectors 2336.

It has further been discovered that the insulation layer 2342 provides improved reliability with a bottom extent of the insulation layer 2342 coplanar with a bottom extent of the exterior conductive layer 2320 and with the peripheral non-horizontal side 2308, non-horizontal sides of the central leads 2346, and non-horizontal sides of the interior leads 2350 covered by the insulation layer 2342 by providing lead interlocking resulting in elimination of lead pullouts.

It has further been discovered that the recess conductive layer 2358 provides improved reliability by reducing wire span of the internal connectors 2336 with the recess conductive layer 2358 providing increased routing area to redistribute electrical signals between the interior leads 2350 and the central leads 2346.

It has further been discovered that the multi-layer conductive structure 2360 and the recess multi-layer conductive structure 2368 provide improved reliability by employing routable method resulting in shortened wire lengths for the internal connectors 2336 with multi-layer traces for added space in routability and thus use less wire material for cost savings.

It has further been discovered that the multi-layer conductive structure 2360 and the recess multi-layer conductive structure 2368 provide improved performance in thermal, electrical, and reliability tests compared to two-layer laminate substrate designs as well as providing lower cost packaging solution, simplified supplier chains, better design rule, and fine line width/space (L/S) capability of the routable conductive traces over Fine Ball Grid Array (FBGA) or land grid array (LGA).

Figure 24:
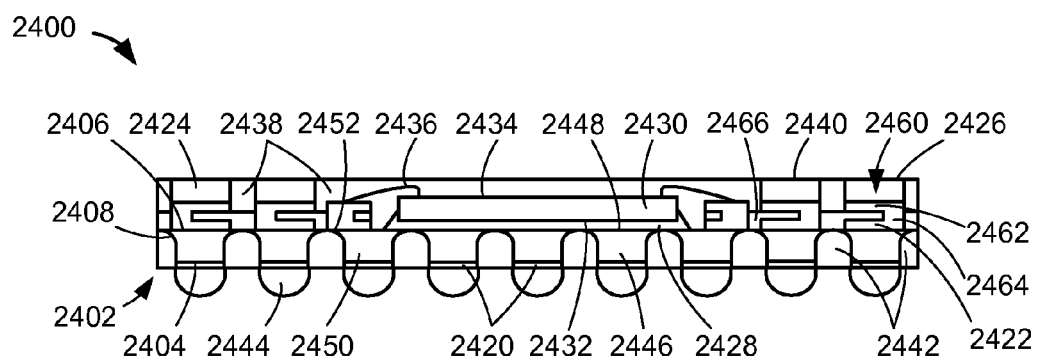
FIG. 24 is a cross-sectional view of an integrated circuit packaging system in a fifth embodiment of the present invention.

Referring now to FIG. 24, therein is shown a cross-sectional view of an integrated circuit packaging system 2400 in a fifth embodiment of the present invention. The integrated circuit packaging system 2400 can include a multiple-layer structure without cavity and without conductive trace under an integrated circuit die.

In a manner similar to the integrated circuit packaging system 100 of FIG. 1, the integrated circuit packaging system 2400 includes peripheral leads 2402, each having a peripheral bottom side 2404, a peripheral top side 2406, and a peripheral non-horizontal side 2408. In a manner similar to the integrated circuit packaging system 100, the integrated circuit packaging system 2400 includes an exterior conductive layer 2420, an interior conductive layer 2422, and vertical connectors 2424 with each of the vertical connectors 2424 having a connector top side 2426.

In a manner similar to the integrated circuit packaging system 100, the integrated circuit packaging system 2400 includes an attach layer 2428 and an integrated circuit 2430 having an inactive side 2432 and an active side 2434. In a manner similar to the integrated circuit packaging system 100, the integrated circuit packaging system 2400 includes internal connectors 2436 and an encapsulation 2438 having an encapsulation top side 2440. In a manner similar to the integrated circuit packaging system 100, the integrated circuit packaging system 2400 includes an insulation layer 2442 and external connectors 2444.

The integrated circuit packaging system 2400 can include central leads 2446, which are defined as structures that provide connectivity between the integrated circuit packaging system 2400 and an external system (not shown). The central leads 2446 can be directly under the integrated circuit 2430. The central leads 2446 conduct heat away from the integrated circuit 2430 to an external system (not shown). Each of the central leads 2446 can include a central lead top side 2448.

The integrated circuit packaging system 2400 can include interior leads 2450, which are defined as structures that provide connectivity between the integrated circuit packaging system 2400 and the external system. The interior leads 2450 can be closest to a non-horizontal side of the integrated circuit 2430. The interior leads 2450 provide connectivity for electrical signals or electrical potential levels between the integrated circuit 2430 and the external system.

Each of the interior leads 2450 can include an interior lead top side 2452. The interior leads 2450, the central leads 2446, and the peripheral leads 2402 are structurally isolated from each other. The peripheral bottom side 2404, bottom extents of the interior leads 2450, and bottom extents of the central leads 2446 can be coplanar with each other. The peripheral top side 2406, the interior lead top side 2452, and the central lead top side 2448 can be coplanar with each other.

The central leads 2446, the interior leads 2450, or a combination thereof altogether function as a support structure including a paddle for mounting or attaching the integrated circuit 2430 thereto. The inactive side 2432 can be attached to the central leads 2446, the interior leads 2450, or a combination thereof with the attach layer 2428. The attach layer 2428 can be attached to the central lead top side 2448, the interior lead top side 2452, or a combination thereof.

The interior conductive layer 2422 can be formed directly on the interior lead top side 2452. The exterior conductive layer 2420 can be formed directly on bottom extents of the central leads 2446 and the interior leads 2450.

Non-horizontal sides of the central leads 2446 and the interior leads 2450 can include curve surfaces. The insulation layer 2442 can be formed directly on the non-horizontal sides of the central leads 2446 and the interior leads 2450. The insulation layer 2442 can be formed directly on a portion of a bottom extent of the attach layer 2428.

The integrated circuit packaging system 2400 can include a multi-layer conductive structure 2460, which is defined as a connection structure with a number of conductive layers providing connectivity between the integrated circuit 2430 and the peripheral leads 2402 or between the integrated circuit 2430 and the interior leads 2450. The multi-layer conductive structure 2460 can include the interior conductive layer 2422. The multi-layer conductive structure 2460 can include an additional interior conductive layer 2462, an interior connection layer 2464, and an interior insulation layer 2466.

The interior conductive layer 2422 is defined as a connection structure that provides connectivity between the peripheral leads 2402 and the additional interior conductive layer 2462. The additional interior conductive layer 2462 is defined as a connection structure that provides connectivity between the interior conductive layer 2422 and the integrated circuit 2430. The interior conductive layer 2422 and the additional interior conductive layer 2462 route electrical connection or redistribute electrical signals between the integrated circuit 2430 and the peripheral leads 2402 or between the integrated circuit 2430 and the interior leads 2450.

The interior connection layer 2464 is defined as a connection structure that provides electrical connectivity between multiple conductive layers. The interior connection layer 2464 can be structurally and electrically connected or attached to the interior conductive layer 2422 and the additional interior conductive layer 2462. The interior insulation layer 2466 is defined as a structure that covers the interior conductive layer 2422 to provide electrical isolation between the interior conductive layer 2422 and the additional interior conductive layer 2462.

The interior conductive layer 2422 and the additional interior conductive layer 2462 can provide electrical connectivity for electrical signals or electrical potential levels. The interior conductive layer 2422 and the additional interior conductive layer 2462 can conduct heat away from the integrated circuit 2430 to the peripheral leads 2402 or from the integrated circuit 2430 to the interior leads 2450.

The interior conductive layer 2422 and the additional interior conductive layer 2462 can include conductive traces. For example, the interior conductive layer 2422 and the additional interior conductive layer 2462 can represent connection structures including embedded routable conductive traces, additive routable conductive traces, or redistribution layers.

A portion of a bottom extent of the interior conductive layer 2422 can be formed directly on the peripheral top side 2406 and the interior lead top side 2452. A bottom extent of the interior conductive layer 2422 can be coplanar with a bottom extent of the interior insulation layer 2466.

The interior connection layer 2464 can be formed directly on a top extent of the interior conductive layer 2422 and a bottom extent of the additional interior conductive layer 2462. The interior connection layer 2464 can be formed through the interior insulation layer 2466. A bottom extent of the additional interior conductive layer 2462 can be formed directly on the interior connection layer 2464 and a top extent of the interior insulation layer 2466. A portion of the additional interior conductive layer 2462 can be formed directly over a portion of the interior conductive layer 2422. The vertical connectors 2424 can be formed directly on a portion of the additional interior conductive layer 2462.

The attach layer 2428 can be attached to the central lead top side 2448, the interior lead top side 2452, or a combination thereof. The integrated circuit 2430 can be mounted over the central leads 2446, the interior leads 2450, or a combination thereof with the attach layer 2428. The internal connectors 2436 can be attached to the active side 2434 and a top extent of the additional interior conductive layer 2462. The insulation layer 2442 can be formed directly on a portion of a bottom extent of the interior insulation layer 2466.

It has been discovered that the vertical connectors 2424 directly on the additional interior conductive layer 2462 provide improved reliability by providing a robust structural integrity with each of the vertical connectors 2424 having the connector top side 2426 for mounting a stack semiconductor package thereon.

It has also been discovered that the central leads 2446 and the interior leads 2450 provide improved vertical height profile reduction for the integrated circuit packaging system 2400 with the integrated circuit 2430 mounted on the central lead top side 2448, the interior lead top side 2452, or a combination thereof.

It has further been discovered that the central lead top side 2448 and the interior lead top side 2452 provide improved reliability for the integrated circuit 2430 to mount thereon resulting in reduced wire span for the internal connectors 2436 to be attached to the integrated circuit 2430 and the interior conductive layer 2422 thereby eliminating electrical shorts between the internal connectors 2436.

It has further been discovered that the insulation layer 2442 provides improved reliability with a bottom extent of the insulation layer 2442 coplanar with a bottom extent of the exterior conductive layer 2420 and with the peripheral non-horizontal side 2408, non-horizontal sides of the central leads 2446, and non-horizontal sides of the interior leads 2450 covered by the insulation layer 2442 by providing lead interlocking resulting in elimination of lead pullouts.

It has further been discovered that the multi-layer conductive structure 2460 provides improved reliability by employing routable method resulting in shortened wire lengths for the internal connectors 2436 with multi-layer traces for added space in routability and thus use less wire material for cost savings.

Figure 25:
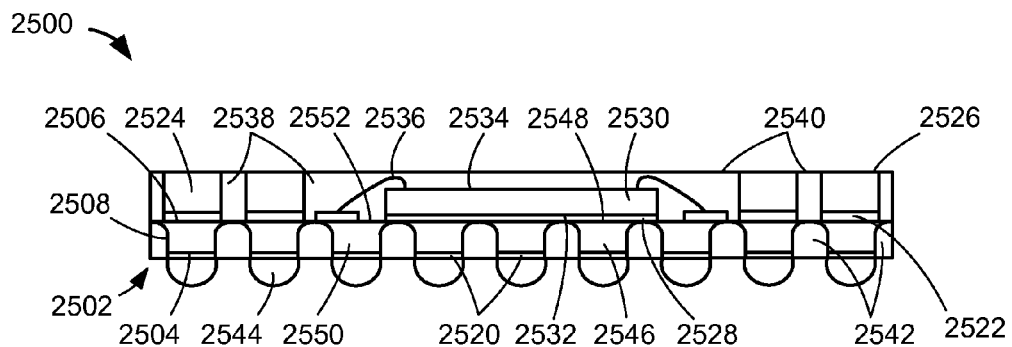
FIG. 25 is a cross-sectional view of an integrated circuit packaging system in a sixth embodiment of the present invention.

Referring now to FIG. 25, therein is shown a cross-sectional view of an integrated circuit packaging system 2500 in a sixth embodiment of the present invention. The integrated circuit packaging system 2500 can include a package structure without cavity and without conductive trace under an integrated circuit die.

In a manner similar to the integrated circuit packaging system 100 of FIG. 1, the integrated circuit packaging system 2500 includes peripheral leads 2502, each having a peripheral bottom side 2504, a peripheral top side 2506, and a peripheral non-horizontal side 2508. In a manner similar to the integrated circuit packaging system 100, the integrated circuit packaging system 2500 includes an exterior conductive layer 2520, an interior conductive layer 2522, and vertical connectors 2524 with each of the vertical connectors 2524 having a connector top side 2526.

In a manner similar to the integrated circuit packaging system 100, the integrated circuit packaging system 2500 includes an attach layer 2528 and an integrated circuit 2530 having an inactive side 2532 and an active side 2534. In a manner similar to the integrated circuit packaging system 100, the integrated circuit packaging system 2500 includes internal connectors 2536 and an encapsulation 2538 having an encapsulation top side 2540. In a manner similar to the integrated circuit packaging system 100, the integrated circuit packaging system 2500 includes an insulation layer 2542 and external connectors 2544.

The integrated circuit packaging system 2500 can include central leads 2546, which are defined as structures that provide connectivity between the integrated circuit packaging system 2500 and an external system (not shown). The central leads 2546 can be directly under the integrated circuit 2530. The central leads 2546 conduct heat away from the integrated circuit 2530 to an external system (not shown). Each of the central leads 2546 can include a central lead top side 2548.

The integrated circuit packaging system 2500 can include interior leads 2550, which are defined as structures that provide connectivity between the integrated circuit packaging system 2500 and the external system. The interior leads 2550 can be closest to a non-horizontal side of the integrated circuit 2530. The interior leads 2550 provide connectivity for electrical signals or electrical potential levels between the integrated circuit 2530 and the external system.

Each of the interior leads 2550 can include an interior lead top side 2552. The interior leads 2550, the central leads 2546, and the peripheral leads 2502 are structurally isolated from each other. The peripheral bottom side 2504, bottom extents of the interior leads 2550, and bottom extents of the central leads 2546 can be coplanar with each other. The peripheral top side 2506, the interior lead top side 2552, and the central lead top side 2548 can be coplanar with each other.

The central leads 2546, the interior leads 2550, or a combination thereof altogether function as a support structure including a paddle for mounting or attaching the integrated circuit 2530 thereto. The inactive side 2532 can be attached to the central leads 2546, the interior leads 2550, or a combination thereof with the attach layer 2528. The attach layer 2528 can be attached to the central lead top side 2548, the interior lead top side 2552, or a combination thereof.

The interior conductive layer 2522 can be formed directly on the interior lead top side 2552. The exterior conductive layer 2520 can be formed directly on bottom extents of the central leads 2546 and the interior leads 2550.

Non-horizontal sides of the central leads 2546 and the interior leads 2550 can include curve surfaces. The insulation layer 2542 can be formed directly on the non-horizontal sides of the central leads 2546 and the interior leads 2550. The insulation layer 2542 can be formed directly on a portion of a bottom extent of the attach layer 2528.

A portion of a bottom extent of the interior conductive layer 2522 can be formed directly on the peripheral top side 2506 and the interior lead top side 2552. The attach layer 2528 can be attached to the central lead top side 2548, the interior lead top side 2552, or a combination thereof. The integrated circuit 2530 can be mounted over the central leads 2546, the interior leads 2550, or a combination thereof with the attach layer 2528. The internal connectors 2536 can be attached to the active side 2534 and a top extent of the interior conductive layer 2522.

It has been discovered that the vertical connectors 2524 directly on the interior conductive layer 2522 provide improved reliability by providing a robust structural integrity with each of the vertical connectors 2524 having the connector top side 2526 for mounting a stack semiconductor package thereon.

It has also been discovered that the central leads 2546 and the interior leads 2550 provide improved vertical height profile reduction for the integrated circuit packaging system 2500 with the integrated circuit 2530 mounted on the central lead top side 2548, the interior lead top side 2552, or a combination thereof.

It has further been discovered that the central lead top side 2548 and the interior lead top side 2552 provide improved reliability for the integrated circuit 2530 to mount thereon resulting in reduced wire span for the internal connectors 2536 to be attached to the integrated circuit 2530 and the interior conductive layer 2522 thereby eliminating electrical shorts between the internal connectors 2536.

It has further been discovered that the insulation layer 2542 provides improved reliability with a bottom extent of the insulation layer 2542 coplanar with a bottom extent of the exterior conductive layer 2520 and with the peripheral non-horizontal side 2508, non-horizontal sides of the central leads 2546, and non-horizontal sides of the interior leads 2550 covered by the insulation layer 2542 by providing lead interlocking resulting in elimination of lead pullouts.

It has further been discovered that the interior conductive layer 2522 provides improved reliability by employing routable method resulting in shortened wire lengths for the internal connectors 2536.

Figure 26:
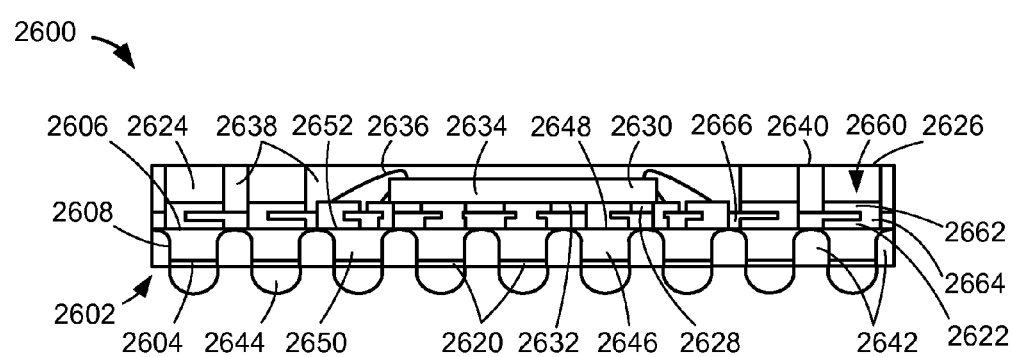
FIG. 26 is a cross-sectional view of an integrated circuit packaging system in a seventh embodiment of the present invention.

Referring now to FIG. 26, therein is shown a cross-sectional view of an integrated circuit packaging system 2600 in a seventh embodiment of the present invention. The integrated circuit packaging system 2600 can include a multiple-layer structure without cavity and with conductive traces under an integrated circuit die.

In a manner similar to the integrated circuit packaging system 100 of FIG. 1, the integrated circuit packaging system 2600 includes peripheral leads 2602, each having a peripheral bottom side 2604, a peripheral top side 2606, and a peripheral non-horizontal side 2608. In a manner similar to the integrated circuit packaging system 100, the integrated circuit packaging system 2600 includes an exterior conductive layer 2620, an interior conductive layer 2622, and vertical connectors 2624 with each of the vertical connectors 2624 having a connector top side 2626.

In a manner similar to the integrated circuit packaging system 100, the integrated circuit packaging system 2600 includes an attach layer 2628 and an integrated circuit 2630 having an inactive side 2632 and an active side 2634. In a manner similar to the integrated circuit packaging system 100, the integrated circuit packaging system 2600 includes internal connectors 2636 and an encapsulation 2638 having an encapsulation top side 2640. In a manner similar to the integrated circuit packaging system 100, the integrated circuit packaging system 2600 includes an insulation layer 2642 and external connectors 2644.

The integrated circuit packaging system 2600 can include central leads 2646, which are defined as structures that provide connectivity between the integrated circuit packaging system 2600 and an external system (not shown). The central leads 2646 can be directly under the integrated circuit 2630. The central leads 2646 conduct heat away from the integrated circuit 2630 to an external system (not shown). Each of the central leads 2646 can include a central lead top side 2648.

The integrated circuit packaging system 2600 can include interior leads 2650, which are defined as structures that provide connectivity between the integrated circuit packaging system 2600 and the external system. The interior leads 2650 can be closest to a non-horizontal side of the integrated circuit 2630. The interior leads 2650 provide connectivity for electrical signals or electrical potential levels between the integrated circuit 2630 and the external system.

Each of the interior leads 2650 can include an interior lead top side 2652. The interior leads 2650, the central leads 2646, and the peripheral leads 2602 are structurally isolated from each other. The peripheral bottom side 2604, bottom extents of the interior leads 2650, and bottom extents of the central leads 2646 can be coplanar with each other. The peripheral top side 2606, the interior lead top side 2652, and the central lead top side 2648 can be coplanar with each other.

The central leads 2646, the interior leads 2650, or a combination thereof altogether function as a support structure including a paddle for mounting or attaching the integrated circuit 2630 thereto. The inactive side 2632 can be attached to the central leads 2646, the interior leads 2650, or a combination thereof with the attach layer 2628. The attach layer 2628 can be attached to the central lead top side 2648, the interior lead top side 2652, or a combination thereof.

The interior conductive layer 2622 can be formed directly on the central lead top side 2648 and the interior lead top side 2652. The exterior conductive layer 2620 can be formed directly on bottom extents of the central leads 2646 and the interior leads 2650.

Non-horizontal sides of the central leads 2646 and the interior leads 2650 can include curve surfaces. The insulation layer 2642 can be formed directly on the non-horizontal sides of the central leads 2646 and the interior leads 2650.

The integrated circuit packaging system 2600 can include a multi-layer conductive structure 2660, which is defined as a connection structure with a number of conductive layers providing connectivity between the integrated circuit 2630 and the peripheral leads 2602, the central leads 2646, or the interior leads 2650. The multi-layer conductive structure 2660 can include the interior conductive layer 2622. The multi-layer conductive structure 2660 can include an additional interior conductive layer 2662, an interior connection layer 2664, and an interior insulation layer 2666.

The interior conductive layer 2622 is defined as a connection structure that provides connectivity between the additional interior conductive layer 2662 and the peripheral leads 2602, the central leads 2646, or the interior leads 2650. The additional interior conductive layer 2662 is defined as a connection structure that provides connectivity between the interior conductive layer 2622 and the integrated circuit 2630. The interior conductive layer 2622 and the additional interior conductive layer 2662 route electrical connection or redistribute electrical signals between the integrated circuit 2630 and the peripheral leads 2602, the central leads 2646, or the interior leads 2650.

The interior connection layer 2664 is defined as a connection structure that provides electrical connectivity between multiple conductive layers. The interior connection layer 2664 can be structurally and electrically connected or attached to the interior conductive layer 2622 and the additional interior conductive layer 2662. The interior insulation layer 2666 is defined as a structure that covers the interior conductive layer 2622 to provide electrical isolation between the interior conductive layer 2622 and the additional interior conductive layer 2662.

The interior conductive layer 2622 and the additional interior conductive layer 2662 can provide electrical connectivity for electrical signals or electrical potential levels. The interior conductive layer 2622 and the additional interior conductive layer 2662 can conduct heat away from the integrated circuit 2630 to the peripheral leads 2602, the central leads 2646, or the interior leads 2650.

The interior conductive layer 2622 and the additional interior conductive layer 2662 can include conductive traces. For example, the interior conductive layer 2622 and the additional interior conductive layer 2662 can represent connection structures including embedded routable conductive traces, additive routable conductive traces, or redistribution layers.

A portion of a bottom extent of the interior conductive layer 2622 can be formed directly on the peripheral top side 2606, the central lead top side 2648, and the interior lead top side 2652. A bottom extent of the interior conductive layer 2622 can be coplanar with a bottom extent of the interior insulation layer 2666.

The interior connection layer 2664 can be formed directly on a top extent of the interior conductive layer 2622 and a bottom extent of the additional interior conductive layer 2662. The interior connection layer 2664 can be formed through the interior insulation layer 2666. A bottom extent of the additional interior conductive layer 2662 can be formed directly on the interior connection layer 2664 and a top extent of the interior insulation layer 2666. A portion of the additional interior conductive layer 2662 can be formed directly over a portion of the interior conductive layer 2622. The vertical connectors 2624 can be formed directly on a portion of the additional interior conductive layer 2662.

The attach layer 2628 can be attached to the additional interior conductive layer 2662 and a portion of a top extent of the interior insulation layer 2666. The integrated circuit 2630 can be mounted over the central leads 2646, the interior leads 2650, or a combination thereof with the attach layer 2628. The internal connectors 2636 can be attached to the active side 2634 and a top extent of the additional interior conductive layer 2662. The insulation layer 2642 can be formed directly on a portion of a bottom extent of the interior insulation layer 2666.

It has been discovered that the vertical connectors 2624 directly on the additional interior conductive layer 2662 provide improved reliability by providing a robust structural integrity with each of the vertical connectors 2624 having the connector top side 2626 for mounting a stack semiconductor package thereon.

It has also been discovered that the central leads 2646 and the interior leads 2650 provide improved support structure for mounting the integrated circuit 2630 mounted thereon.

It has further been discovered that the insulation layer 2642 provides improved reliability with a bottom extent of the insulation layer 2642 coplanar with a bottom extent of the exterior conductive layer 2620 and with the peripheral non-horizontal side 2608, non-horizontal sides of the central leads 2646, and non-horizontal sides of the interior leads 2650 covered by the insulation layer 2642 by providing lead interlocking resulting in elimination of lead pullouts.

It has further been discovered that the multi-layer conductive structure 2660 provides improved reliability by employing routable method resulting in shortened wire lengths for the internal connectors 2636 with multi-layer traces for added space in routability and thus use less wire material for cost savings.

Figure 27:
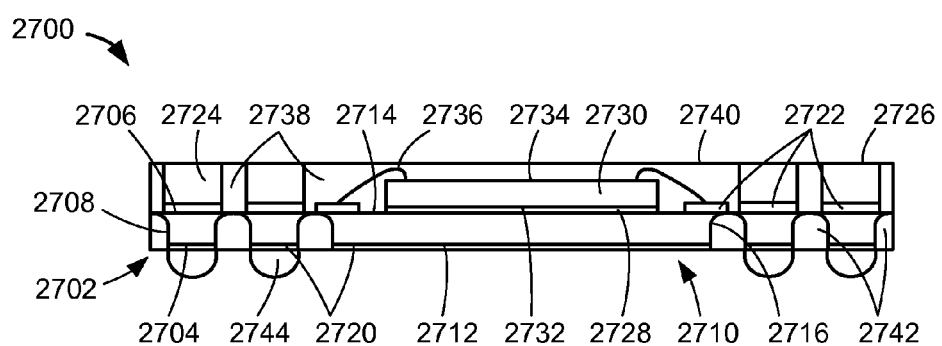
FIG. 27 is a cross-sectional view of an integrated circuit packaging system in an eighth embodiment of the present invention.

Referring now to FIG. 27, therein is shown a cross-sectional view of an integrated circuit packaging system 2700 in an eighth embodiment of the present invention. The integrated circuit packaging system 2700 can include a package structure without cavity, without traces under an integrated circuit die, and without conductive balls under a die paddle.

In a manner similar to the integrated circuit packaging system 100 of FIG. 1, the integrated circuit packaging system 2700 includes peripheral leads 2702, each having a peripheral bottom side 2704, a peripheral top side 2706, and a peripheral non-horizontal side 2708. In a manner similar to the integrated circuit packaging system 100 of FIG. 1, the integrated circuit packaging system 2700 includes a package paddle 2710 having a paddle bottom side 2712, a paddle top side 2714, and a paddle non-horizontal side 2716.

In a manner similar to the integrated circuit packaging system 100, the integrated circuit packaging system 2700 includes an exterior conductive layer 2720, an interior conductive layer 2722, and vertical connectors 2724 with each of the vertical connectors 2724 having a connector top side 2726. In a manner similar to the integrated circuit packaging system 100, the integrated circuit packaging system 2700 includes an attach layer 2728 and an integrated circuit 2730 having an inactive side 2732 and an active side 2734.

In a manner similar to the integrated circuit packaging system 100, the integrated circuit packaging system 2700 includes internal connectors 2736 and an encapsulation 2738 having an encapsulation top side 2740. In a manner similar to the integrated circuit packaging system 100, the integrated circuit packaging system 2700 includes an insulation layer 2742 and external connectors 2744.

The integrated circuit 2730 can be mounted over the package paddle 2710. The attach layer 2728 can be attached to the inactive side 2732 and the paddle top side 2714.

It has been discovered that the vertical connectors 2724 directly on the interior conductive layer 2722 provide improved reliability by providing a robust structural integrity with each of the vertical connectors 2724 having the connector top side 2726 for mounting a stack semiconductor package thereon.

It has also been discovered that the package paddle 2710 provides improved vertical height profile reduction for the integrated circuit packaging system 2700 with the integrated circuit 2730 mounted over the paddle top side 2714.

It has further been discovered that the insulation layer 2742 provides improved reliability with a bottom extent of the insulation layer 2742 coplanar with a bottom extent of the exterior conductive layer 2720 and with the peripheral non-horizontal side 2708 and the paddle non-horizontal side 2716 covered by the insulation layer 2742 by providing lead interlocking resulting in elimination of lead pullouts.

It has further been discovered that the interior conductive layer 2722 provides improved reliability by employing routable method resulting in shortened wire lengths for the internal connectors 2736.

Figure 28:
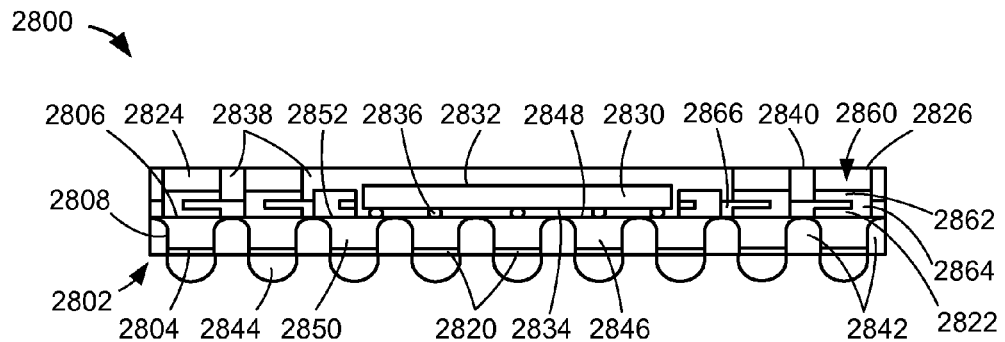
FIG. 28 is a cross-sectional view of an integrated circuit packaging system in a ninth embodiment of the present invention.

Referring now to FIG. 28, therein is shown a cross-sectional view of an integrated circuit packaging system 2800 in a ninth embodiment of the present invention. The integrated circuit packaging system 2800 can include a multiple-layer structure without cavity and without conductive trace under an integrated circuit die.

In a manner similar to the integrated circuit packaging system 100 of FIG. 1, the integrated circuit packaging system 2800 includes peripheral leads 2802, each having a peripheral bottom side 2804, a peripheral top side 2806, and a peripheral non-horizontal side 2808. In a manner similar to the integrated circuit packaging system 100, the integrated circuit packaging system 2800 includes an exterior conductive layer 2820, an interior conductive layer 2822, and vertical connectors 2824 with each of the vertical connectors 2824 having a connector top side 2826.

In a manner similar to the integrated circuit packaging system 100, the integrated circuit packaging system 2800 includes an integrated circuit 2830 having an inactive side 2832 and an active side 2834. In a manner similar to the integrated circuit packaging system 100, the integrated circuit packaging system 2800 includes internal connectors 2836 and an encapsulation 2838 having an encapsulation top side 2840. In a manner similar to the integrated circuit packaging system 100, the integrated circuit packaging system 2800 includes an insulation layer 2842 and external connectors 2844.

The integrated circuit packaging system 2800 can include central leads 2846, which are defined as structures that provide connectivity between the integrated circuit packaging system 2800 and an external system (not shown). The central leads 2846 can be directly under the integrated circuit 2830. The central leads 2846 conduct heat away from the integrated circuit 2830 to an external system (not shown). Each of the central leads 2846 can include a central lead top side 2848.

The integrated circuit packaging system 2800 can include interior leads 2850, which are defined as structures that provide connectivity between the integrated circuit packaging system 2800 and the external system. The interior leads 2850 can be closest to a non-horizontal side of the integrated circuit 2830. The interior leads 2850 provide connectivity for electrical signals or electrical potential levels between the integrated circuit 2830 and the external system.

Each of the interior leads 2850 can include an interior lead top side 2852. The interior leads 2850, the central leads 2846, and the peripheral leads 2802 are structurally isolated from each other. The peripheral bottom side 2804, bottom extents of the interior leads 2850, and bottom extents of the central leads 2846 can be coplanar with each other. The peripheral top side 2806, the interior lead top side 2852, and the central lead top side 2848 can be coplanar with each other.

The central leads 2846, the interior leads 2850, or a combination thereof altogether function as a support structure including a paddle for mounting or attaching the integrated circuit 2830 thereto. The inactive side 2832 can be attached to the central leads 2846, the interior leads 2850, or a combination thereof.

The interior conductive layer 2822 can be formed directly on the interior lead top side 2852. The exterior conductive layer 2820 can be formed directly on bottom extents of the central leads 2846 and the interior leads 2850.

Non-horizontal sides of the central leads 2846 and the interior leads 2850 can include curve surfaces. The insulation layer 2842 can be formed directly on the non-horizontal sides of the central leads 2846 and the interior leads 2850.

The integrated circuit packaging system 2800 can include a multi-layer conductive structure 2860, which is defined as a connection structure with a number of conductive layers providing connectivity between the integrated circuit 2830 and the peripheral leads 2802 or between the integrated circuit 2830 and the interior leads 2850. The multi-layer conductive structure 2860 can include the interior conductive layer 2822. The multi-layer conductive structure 2860 can include an additional interior conductive layer 2862, an interior connection layer 2864, and an interior insulation layer 2866.

The interior conductive layer 2822 is defined as a connection structure that provides connectivity between the peripheral leads 2802 and the additional interior conductive layer 2862. The additional interior conductive layer 2862 is defined as a connection structure that provides connectivity between the interior conductive layer 2822 and the integrated circuit 2830. The interior conductive layer 2822 and the additional interior conductive layer 2862 route electrical connection or redistribute electrical signals between the integrated circuit 2830 and the peripheral leads 2802 or between the integrated circuit 2830 and the interior leads 2850.

The interior connection layer 2864 is defined as a connection structure that provides electrical connectivity between multiple conductive layers. The interior connection layer 2864 can be structurally and electrically connected or attached to the interior conductive layer 2822 and the additional interior conductive layer 2862. The interior insulation layer 2866 is defined as a structure that covers the interior conductive layer 2822 to provide electrical isolation between the interior conductive layer 2822 and the additional interior conductive layer 2862.

The interior conductive layer 2822 and the additional interior conductive layer 2862 can provide electrical connectivity for electrical signals or electrical potential levels. The interior conductive layer 2822 and the additional interior conductive layer 2862 can conduct heat away from the integrated circuit 2830 to the peripheral leads 2802 or from the integrated circuit 2830 to the interior leads 2850.

The interior conductive layer 2822 and the additional interior conductive layer 2862 can include conductive traces. For example, the interior conductive layer 2822 and the additional interior conductive layer 2862 can represent connection structures including embedded routable conductive traces, additive routable conductive traces, or redistribution layers.

A portion of a bottom extent of the interior conductive layer 2822 can be formed directly on the peripheral top side 2806 and the interior lead top side 2852. A bottom extent of the interior conductive layer 2822 can be coplanar with a bottom extent of the interior insulation layer 2866.

The interior connection layer 2864 can be formed directly on a top extent of the interior conductive layer 2822 and a bottom extent of the additional interior conductive layer 2862. The interior connection layer 2864 can be formed through the interior insulation layer 2866. A bottom extent of the additional interior conductive layer 2862 can be formed directly on the interior connection layer 2864 and a top extent of the interior insulation layer 2866. A portion of the additional interior conductive layer 2862 can be formed directly over a portion of the interior conductive layer 2822. The vertical connectors 2824 can be formed directly on a portion of the additional interior conductive layer 2862.

The integrated circuit 2830 can be mounted over the central leads 2846, the interior leads 2850, or a combination thereof. The internal connectors 2836 can be attached to the active side 2834, the central lead top side 2848, and the interior lead top side 2852.

For example, the integrated circuit 2830 can represent a semiconductor device including a flip chip or a silicon (Si) die. Also for example, the internal connectors 2836 can represent electrically conductive connectors including conductive bumps or conductive balls.

It has been discovered that the vertical connectors 2824 directly on the additional interior conductive layer 2862 provide improved reliability by providing a robust structural integrity with each of the vertical connectors 2824 having the connector top side 2826 for mounting a stack semiconductor package thereon.

It has also been discovered that the central leads 2846 and the interior leads 2850 provide improved vertical height profile reduction for the integrated circuit packaging system 2800 with the integrated circuit 2830 mounted on the central lead top side 2848, the interior lead top side 2852, or a combination thereof.

It has further been discovered that the central lead top side 2848 and the interior lead top side 2852 provide improved reliability for the integrated circuit 2830 to mount thereon resulting in reduced wire span for the internal connectors 2836 to be attached to the integrated circuit 2830 and the interior conductive layer 2822 thereby eliminating electrical shorts between the internal connectors 2836.

It has further been discovered that the insulation layer 2842 provides improved reliability with a bottom extent of the insulation layer 2842 coplanar with a bottom extent of the exterior conductive layer 2820 and with the peripheral non-horizontal side 2808, non-horizontal sides of the central leads 2846, and non-horizontal sides of the interior leads 2850 covered by the insulation layer 2842 by providing lead interlocking resulting in elimination of lead pullouts.

It has further been discovered that the multi-layer conductive structure 2860 provides improved reliability by employing routable method resulting in shortened wire lengths for the internal connectors 2836 with multi-layer traces for added space in routability and thus use less wire material for cost savings.

Figure 29:
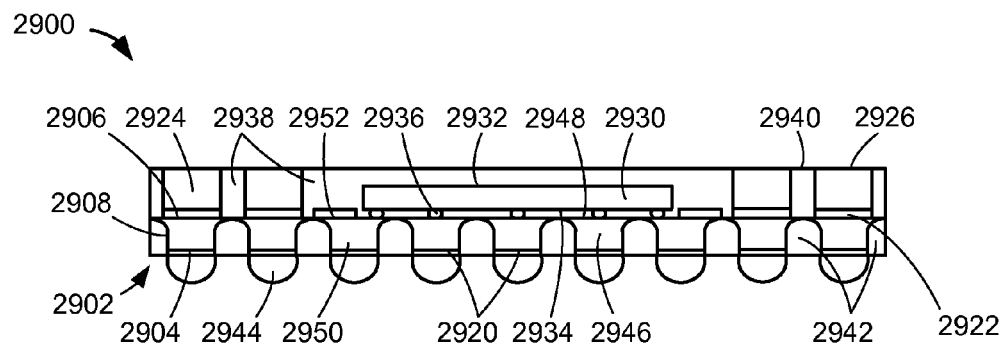
FIG. 29 is a cross-sectional view of an integrated circuit packaging system in a tenth embodiment of the present invention.

Referring now to FIG. 29, therein is shown a cross-sectional view of an integrated circuit packaging system 2900 in a tenth embodiment of the present invention. The integrated circuit packaging system 2900 can include a package structure without cavity and without conductive trace under an integrated circuit die.

In a manner similar to the integrated circuit packaging system 100 of FIG. 1, the integrated circuit packaging system 2900 includes peripheral leads 2902, each having a peripheral bottom side 2904, a peripheral top side 2906, and a peripheral non-horizontal side 2908. In a manner similar to the integrated circuit packaging system 100, the integrated circuit packaging system 2900 includes an exterior conductive layer 2920, an interior conductive layer 2922, and vertical connectors 2924 with each of the vertical connectors 2924 having a connector top side 2926.

In a manner similar to the integrated circuit packaging system 100, the integrated circuit packaging system 2900 includes an integrated circuit 2930 having an inactive side 2932 and an active side 2934. In a manner similar to the integrated circuit packaging system 100, the integrated circuit packaging system 2900 includes internal connectors 2936 and an encapsulation 2938 having an encapsulation top side 2940. In a manner similar to the integrated circuit packaging system 100, the integrated circuit packaging system 2900 includes an insulation layer 2942 and external connectors 2944.

The integrated circuit packaging system 2900 can include central leads 2946, which are defined as structures that provide connectivity between the integrated circuit packaging system 2900 and an external system (not shown). The central leads 2946 can be directly under the integrated circuit 2930. The central leads 2946 conduct heat away from the integrated circuit 2930 to an external system (not shown). Each of the central leads 2946 can include a central lead top side 2948.

The integrated circuit packaging system 2900 can include interior leads 2950, which are defined as structures that provide connectivity between the integrated circuit packaging system 2900 and the external system. The interior leads 2950 can be closest to a non-horizontal side of the integrated circuit 2930. The interior leads 2950 provide connectivity for electrical signals or electrical potential levels between the integrated circuit 2930 and the external system.

Each of the interior leads 2950 can include an interior lead top side 2952. The interior leads 2950, the central leads 2946, and the peripheral leads 2902 are structurally isolated from each other. The peripheral bottom side 2904, bottom extents of the interior leads 2950, and bottom extents of the central leads 2946 can be coplanar with each other. The peripheral top side 2906, the interior lead top side 2952, and the central lead top side 2948 can be coplanar with each other.

The central leads 2946, the interior leads 2950, or a combination thereof altogether function as a support structure including a paddle for mounting or attaching the integrated circuit 2930 thereto. The inactive side 2932 can be attached to the central leads 2946, the interior leads 2950, or a combination thereof.

The interior conductive layer 2922 can be formed directly on the interior lead top side 2952. The exterior conductive layer 2920 can be formed directly on bottom extents of the central leads 2946 and the interior leads 2950.

Non-horizontal sides of the central leads 2946 and the interior leads 2950 can include curve surfaces. The insulation layer 2942 can be formed directly on the non-horizontal sides of the central leads 2946 and the interior leads 2950.

A portion of a bottom extent of the interior conductive layer 2922 can be formed directly on the peripheral top side 2906 and the interior lead top side 2952. The integrated circuit 2930 can be mounted over the central leads 2946, the interior leads 2950, or a combination thereof. The internal connectors 2936 can be attached to the active side 2934, the central lead top side 2948, and the interior lead top side 2952.

For example, the integrated circuit 2930 can represent a semiconductor device including a flip chip or a silicon (Si) die. Also for example, the internal connectors 2936 can represent electrically conductive connectors including conductive bumps or conductive balls.

It has been discovered that the vertical connectors 2924 directly on the interior conductive layer 2922 provide improved reliability by providing a robust structural integrity with each of the vertical connectors 2924 having the connector top side 2926 for mounting a stack semiconductor package thereon.

It has also been discovered that the central leads 2946 and the interior leads 2950 provide improved vertical height profile reduction for the integrated circuit packaging system 2900 with the integrated circuit 2930 mounted on the central lead top side 2948, the interior lead top side 2952, or a combination thereof.

It has further been discovered that the central lead top side 2948 and the interior lead top side 2952 provide improved reliability for the integrated circuit 2930 to mount thereon resulting in reduced wire span for the internal connectors 2936 to be attached to the integrated circuit 2930 and the interior conductive layer 2922 thereby eliminating electrical shorts between the internal connectors 2936.

It has further been discovered that the insulation layer 2942 provides improved reliability with a bottom extent of the insulation layer 2942 coplanar with a bottom extent of the exterior conductive layer 2920 and with the peripheral non-horizontal side 2908, non-horizontal sides of the central leads 2946, and non-horizontal sides of the interior leads 2950 covered by the insulation layer 2942 by providing lead interlocking resulting in elimination of lead pullouts.

It has further been discovered that the interior conductive layer 2922 provides improved reliability by employing routable method resulting in shortened wire lengths for the internal connectors 2936.

Figure 30:
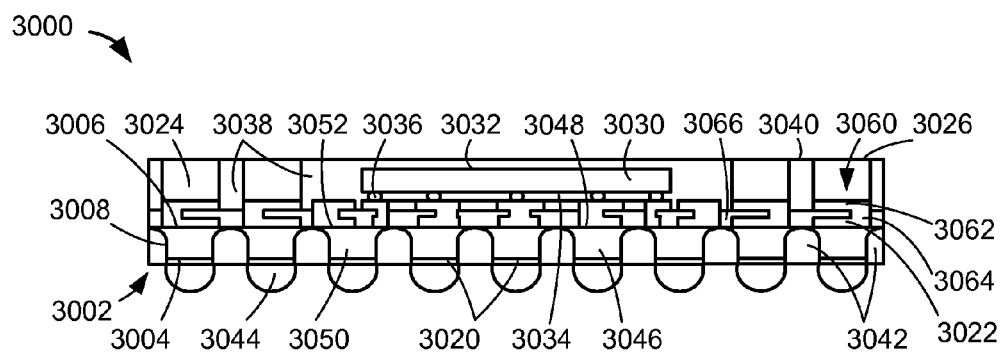
FIG. 30 is a cross-sectional view of an integrated circuit packaging system in an eleventh embodiment of the present invention.

Referring now to FIG. 30, therein is shown a cross-sectional view of an integrated circuit packaging system 3000 in an eleventh embodiment of the present invention. The integrated circuit packaging system 3000 can include a multiple-layer structure without cavity and with conductive traces under an integrated circuit die.

In a manner similar to the integrated circuit packaging system 100 of FIG. 1, the integrated circuit packaging system 3000 includes peripheral leads 3002, each having a peripheral bottom side 3004, a peripheral top side 3006, and a peripheral non-horizontal side 3008. In a manner similar to the integrated circuit packaging system 100, the integrated circuit packaging system 3000 includes an exterior conductive layer 3020, an interior conductive layer 3022, and vertical connectors 3024 with each of the vertical connectors 3024 having a connector top side 3026.

In a manner similar to the integrated circuit packaging system 100, the integrated circuit packaging system 3000 includes an integrated circuit 3030 having an inactive side 3032 and an active side 3034. In a manner similar to the integrated circuit packaging system 100, the integrated circuit packaging system 3000 includes internal connectors 3036 and an encapsulation 3038 having an encapsulation top side 3040. In a manner similar to the integrated circuit packaging system 100, the integrated circuit packaging system 3000 includes an insulation layer 3042 and external connectors 3044.

The integrated circuit packaging system 3000 can include central leads 3046, which are defined as structures that provide connectivity between the integrated circuit packaging system 3000 and an external system (not shown). The central leads 3046 can be directly under the integrated circuit 3030. The central leads 3046 conduct heat away from the integrated circuit 3030 to an external system (not shown). Each of the central leads 3046 can include a central lead top side 3048.

The integrated circuit packaging system 3000 can include interior leads 3050, which are defined as structures that provide connectivity between the integrated circuit packaging system 3000 and the external system. The interior leads 3050 can be closest to a non-horizontal side of the integrated circuit 3030. The interior leads 3050 provide connectivity for electrical signals or electrical potential levels between the integrated circuit 3030 and the external system.

Each of the interior leads 3050 can include an interior lead top side 3052. The interior leads 3050, the central leads 3046, and the peripheral leads 3002 are structurally isolated from each other. The peripheral bottom side 3004, bottom extents of the interior leads 3050, and bottom extents of the central leads 3046 can be coplanar with each other. The peripheral top side 3006, the interior lead top side 3052, and the central lead top side 3048 can be coplanar with each other.

The central leads 3046, the interior leads 3050, or a combination thereof altogether function as a support structure including a paddle for mounting or attaching the integrated circuit 3030 thereto. The interior conductive layer 3022 can be formed directly on the central lead top side 3048 and the interior lead top side 3052. The exterior conductive layer 3020 can be formed directly on bottom extents of the central leads 3046 and the interior leads 3050.

Non-horizontal sides of the central leads 3046 and the interior leads 3050 can include curve surfaces. The insulation layer 3042 can be formed directly on the non-horizontal sides of the central leads 3046 and the interior leads 3050.

The integrated circuit packaging system 3000 can include a multi-layer conductive structure 3060, which is defined as a connection structure with a number of conductive layers providing connectivity between the integrated circuit 3030 and the peripheral leads 3002, the central leads 3046, or the interior leads 3050. The multi-layer conductive structure 3060 can include the interior conductive layer 3022. The multi-layer conductive structure 3060 can include an additional interior conductive layer 3062, an interior connection layer 3064, and an interior insulation layer 3066.

The interior conductive layer 3022 is defined as a connection structure that provides connectivity between the additional interior conductive layer 3062 and the peripheral leads 3002, the central leads 3046, or the interior leads 3050. The additional interior conductive layer 3062 is defined as a connection structure that provides connectivity between the interior conductive layer 3022 and the integrated circuit 3030. The interior conductive layer 3022 and the additional interior conductive layer 3062 route electrical connection or redistribute electrical signals between the integrated circuit 3030 and the peripheral leads 3002, the central leads 3046, or the interior leads 3050.

The interior connection layer 3064 is defined as a connection structure that is structurally and electrically connected or attached to the interior conductive layer 3022 and the additional interior conductive layer 3062. The interior insulation layer 3066 is defined as a structure that covers the interior conductive layer 3022 to provide electrical isolation between the interior conductive layer 3022 and the additional interior conductive layer 3062.

The interior conductive layer 3022 and the additional interior conductive layer 3062 can provide electrical connectivity for electrical signals or electrical potential levels. The interior conductive layer 3022 and the additional interior conductive layer 3062 can conduct heat away from the integrated circuit 3030 to the peripheral leads 3002, the central leads 3046, or the interior leads 3050.

The interior conductive layer 3022 and the additional interior conductive layer 3062 can include conductive traces. For example, the interior conductive layer 3022 and the additional interior conductive layer 3062 can represent connection structures including embedded routable conductive traces, additive routable conductive traces, or redistribution layers.

A portion of a bottom extent of the interior conductive layer 3022 can be formed directly on the peripheral top side 3006, the central lead top side 3048, and the interior lead top side 3052. A bottom extent of the interior conductive layer 3022 can be coplanar with a bottom extent of the interior insulation layer 3066.

The interior connection layer 3064 can be formed directly on a top extent of the interior conductive layer 3022 and a bottom extent of the additional interior conductive layer 3062. The interior connection layer 3064 can be formed through the interior insulation layer 3066. A bottom extent of the additional interior conductive layer 3062 can be formed directly on the interior connection layer 3064 and a top extent of the interior insulation layer 3066. A portion of the additional interior conductive layer 3062 can be formed directly over a portion of the interior conductive layer 3022. The vertical connectors 3024 can be formed directly on a portion of the additional interior conductive layer 3062.

The integrated circuit 3030 can be mounted over the central leads 3046, the interior leads 3050, or a combination thereof. The internal connectors 3036 can be attached to the active side 3034 and a top extent of the additional interior conductive layer 3062. The insulation layer 3042 can be formed directly on a portion of a bottom extent of the interior insulation layer 3066.

For example, the integrated circuit 3030 can represent a semiconductor device including a flip chip or a silicon (Si) die. Also for example, the internal connectors 3036 can represent electrically conductive connectors including conductive bumps or conductive balls.

It has been discovered that the vertical connectors 3024 directly on the additional interior conductive layer 3062 provide improved reliability by providing a robust structural integrity with each of the vertical connectors 3024 having the connector top side 3026 for mounting a stack semiconductor package thereon.

It has also been discovered that the central leads 3046 and the interior leads 3050 provide improved support structure for mounting the integrated circuit 3030 mounted thereon.

It has further been discovered that the insulation layer 3042 provides improved reliability with a bottom extent of the insulation layer 3042 coplanar with a bottom extent of the exterior conductive layer 3020 and with the peripheral non-horizontal side 3008, non-horizontal sides of the central leads 3046, and non-horizontal sides of the interior leads 3050 covered by the insulation layer 3042 by providing lead interlocking resulting in elimination of lead pullouts.

It has further been discovered that the multi-layer conductive structure 3060 provides improved reliability by employing routable method resulting in shortened wire lengths for the internal connectors 3036 with multi-layer traces for added space in routability and thus use less wire material for cost savings.

Figure 31:
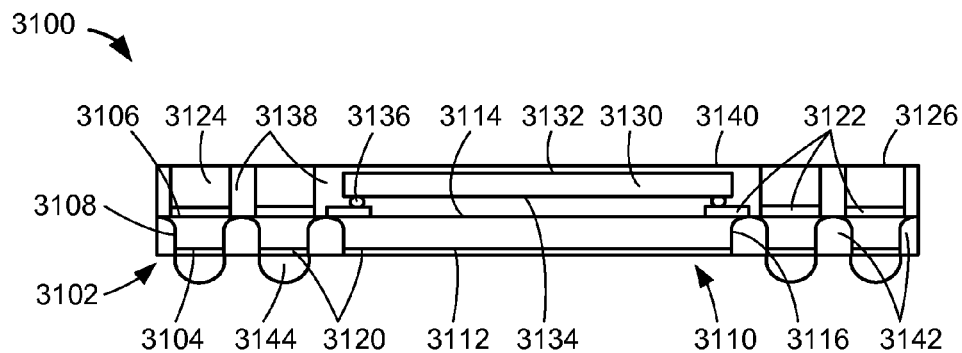
FIG. 31 is a cross-sectional view of an integrated circuit packaging system in a twelfth embodiment of the present invention.

Referring now to FIG. 31, therein is shown a cross-sectional view of an integrated circuit packaging system 3100 in a twelfth embodiment of the present invention. The integrated circuit packaging system 3100 can include a package structure without cavity, without traces under an integrated circuit die, and without conductive balls under a die paddle.

In a manner similar to the integrated circuit packaging system 100 of FIG. 1, the integrated circuit packaging system 3100 includes peripheral leads 3102, each having a peripheral bottom side 3104, a peripheral top side 3106, and a peripheral non-horizontal side 3108. In a manner similar to the integrated circuit packaging system 100 of FIG. 1, the integrated circuit packaging system 3100 includes a package paddle 3110 having a paddle bottom side 3112, a paddle top side 3114, and a paddle non-horizontal side 3116.

In a manner similar to the integrated circuit packaging system 100, the integrated circuit packaging system 3100 includes an exterior conductive layer 3120, an interior conductive layer 3122, and vertical connectors 3124 with each of the vertical connectors 3124 having a connector top side 3126. In a manner similar to the integrated circuit packaging system 100, the integrated circuit packaging system 3100 includes an integrated circuit 3130 having an inactive side 3132 and an active side 3134.

In a manner similar to the integrated circuit packaging system 100, the integrated circuit packaging system 3100 includes internal connectors 3136 and an encapsulation 3138 having an encapsulation top side 3140. In a manner similar to the integrated circuit packaging system 100, the integrated circuit packaging system 3100 includes an insulation layer 3142 and external connectors 3144.

The integrated circuit 3130 can be mounted over the package paddle 3110. The internal connectors 3136 can be attached to the active side and a top extent of the interior conductive layer 3122.

For example, the integrated circuit 3130 can represent a semiconductor device including a flip chip or a silicon (Si) die. Also for example, the internal connectors 3136 can represent electrically conductive connectors including conductive bumps or conductive balls.

It has been discovered that the vertical connectors 3124 directly on the interior conductive layer 3122 provide improved reliability by providing a robust structural integrity with each of the vertical connectors 3124 having the connector top side 3126 for mounting a stack semiconductor package thereon.

It has also been discovered that the package paddle 3110 provides improved vertical height profile reduction for the integrated circuit packaging system 3100 with the integrated circuit 3130 mounted over the paddle top side 3114.

It has further been discovered that the insulation layer 3142 provides improved reliability with a bottom extent of the insulation layer 3142 coplanar with a bottom extent of the exterior conductive layer 3120 and with the peripheral non-horizontal side 3108 and the paddle non-horizontal side 3116 covered by the insulation layer 3142 by providing lead interlocking resulting in elimination of lead pullouts.

It has further been discovered that the interior conductive layer 3122 provides improved reliability by employing routable method resulting in shortened wire lengths for the internal connectors 3136.

Figure 32:
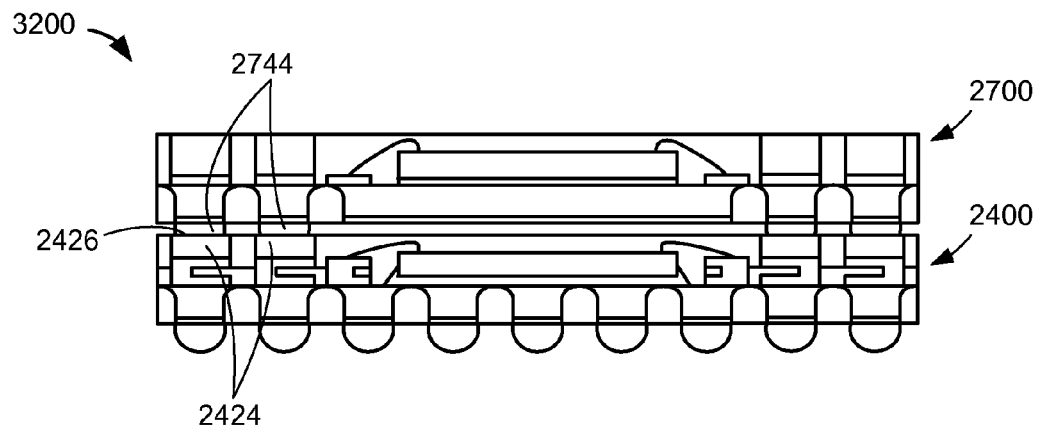
FIG. 32 is a cross-sectional view of an integrated circuit packaging system in a thirteenth embodiment of the present invention.

Referring now to FIG. 32, therein is shown a cross-sectional view of an integrated circuit packaging system 3200 in a thirteenth embodiment of the present invention. The integrated circuit packaging system 3200 can include the integrated circuit packaging system 2700 mounted over the integrated circuit packaging system 2400.

The external connectors 2744 can be attached directly on the connector top side 2426 of each of the vertical connectors 2424. The integrated circuit packaging system 2700 can be stacked over the integrated circuit packaging system 2400 by a mount method including printing method if there is none of the external connectors 2744. Stacking can be done one-to-one for memory devices. This means that there can be the same number of the external connectors 2744 as the vertical connectors 2424.

For illustration purposes, the cross-sectional view depicts the integrated circuit packaging system 2400 having a stack of the integrated circuit packaging system 2700 over the integrated circuit packaging system 2400, although it is understood that the integrated circuit packaging system 2400 can include a stack of any combination of embodiments of the present invention.

Figure 33:
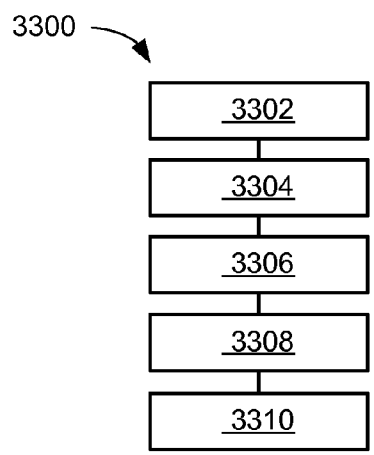
FIG. 33 is a flow chart of a method of manufacture of the integrated circuit packaging system in a further embodiment of the present invention.

Referring now to FIG. 33, therein is shown a flow chart of a method 3300 of manufacture of the integrated circuit packaging system 100 in a further embodiment of the present invention. The method 3300 includes: forming a peripheral lead in a block 3302; forming an interior conductive layer directly on the peripheral lead in a block 3304; forming a vertical connector directly on the interior conductive layer, the vertical connector having a connector top side in a block 3306; connecting an integrated circuit to the interior conductive layer in a block 3308; and forming an encapsulation over the integrated circuit, the encapsulation having an encapsulation top side coplanar with the connector top side in a block 3310.

Thus, it has been discovered that the integrated circuit packaging system of the present invention furnishes important and heretofore unknown and unavailable solutions, capabilities, and functional aspects for an integrated circuit packaging system with package-on-package. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a plurality of peripheral leads;
    forming an interior conductive layer directly on at least one of the plurality of peripheral leads;
    forming a vertical connector directly on the interior conductive layer, the vertical connector having a connector top side;
    connecting an integrated circuit to the interior conductive layer;
    forming an encapsulation over the integrated circuit, the encapsulation having an encapsulation top side coplanar with the connector top side;
    forming a package paddle surrounded by the plurality of peripheral leads; and
    mounting the integrated circuit over the package paddle.

2. A method of manufacture of an integrated circuit packaging system comprising:
    forming a peripheral lead;
    forming an interior conductive layer directly on the peripheral lead;
    forming a vertical connector directly on the interior conductive layer, the vertical connector having a connector top side;
    connecting an integrated circuit to the interior conductive layer;
    forming an encapsulation over the integrated circuit, the encapsulation having an encapsulation top side coplanar with the connector top side; and
    forming an insulation layer directly on the peripheral lead.

3. The method as claimed in claim 2 further comprising:
    forming a central lead having a central lead top side below a peripheral top side of the peripheral lead; and
    forming a recess conductive layer directly on the central lead top side.

4. The method as claimed in claim 2 further comprising forming a central lead having a central lead top side coplanar with a peripheral top side of the peripheral lead.

5. The method as claimed in claim 2 further comprising:
    forming a central lead surrounded by a plurality of the peripheral lead; and
    attaching an attach layer to the central lead.

6. The method as claimed in claim 2 wherein connecting the integrated circuit includes connecting a flip chip to the interior conductive layer.

7. An integrated circuit packaging system comprising:
    a plurality of peripheral leads;
    an interior conductive layer directly on at least one of the plurality of peripheral leads;
    a vertical connector directly on the interior conductive layer, the vertical connector having a connector top side;
    an integrated circuit connected to the interior conductive layer;
    an encapsulation over the integrated circuit, the encapsulation having an encapsulation top side coplanar with the connector top side;
    a package paddle surrounded by the plurality of peripheral leads; and
    wherein:
    the integrated circuit is over the package paddle.

8. The system as claimed in claim 7 further comprising an insulation layer directly on at least one of the plurality of peripheral leads.

* * * * *